(12) United States Patent
Lee et al.

(10) Patent No.: US 11,532,527 B2
(45) Date of Patent: Dec. 20, 2022

(54) SEMICONDUCTOR DEVICE AND METHOD FOR FABRICATING THE SAME

(71) Applicant: SK hynix Inc., Gyeonggi-do (KR)

(72) Inventors: Sang Young Lee, Seoul (KR); Kyung Woong Park, Gyeonggi-do (KR); Han Joon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/189,536

(22) Filed: Mar. 2, 2021

(65) Prior Publication Data

US 2021/0183718 A1 Jun. 17, 2021

Related U.S. Application Data

(63) Continuation of application No. 16/233,907, filed on Dec. 27, 2018, now Pat. No. 10,964,614.

(30) Foreign Application Priority Data

Sep. 28, 2018 (KR) ........................ 10-2018-0116441

(51) Int. Cl.
*H01L 23/29* (2006.01)
*H01L 49/02* (2006.01)
*H01L 23/532* (2006.01)
*H01L 27/108* (2006.01)

(52) U.S. Cl.
CPC ........ *H01L 23/291* (2013.01); *H01L 23/5329* (2013.01); *H01L 28/40* (2013.01); *H01L 27/108* (2013.01)

(58) Field of Classification Search
CPC ... H01L 23/291; H01L 23/5329; H01L 28/40; H01L 27/108; H01L 27/10852; H01L 23/642; H01L 28/75; H01L 21/02181; H01L 21/02189; H01L 21/02554; H01L 21/7685; H01L 21/76865; H01L 21/7687; H01L 28/91
See application file for complete search history.

(56) References Cited

U.S. PATENT DOCUMENTS 8,861,179 B2 * 10/2014 Krishnan ................. H01G 4/10
361/313

* cited by examiner

*Primary Examiner* — Cuong B Nguyen
(74) *Attorney, Agent, or Firm* — IP & T Group LLP

(57) ABSTRACT

A semiconductor device includes a dielectric layer, a conductive layer formed over the dielectric layer, and a reduction sacrificial layer formed between the dielectric layer and the conductive layer, wherein the reduction sacrificial layer includes a first reduction sacrificial material having higher electronegativity than the dielectric layer, and a second reduction sacrificial material having higher electronegativity than the first reduction sacrificial material.

18 Claims, 33 Drawing Sheets

SEMICONDUCTOR DEVICE AND METHOD FOR FABRICATING THE SAME

CROSS-REFERENCE TO RELATED APPLICATIONS

This application is a continuation of U.S. patent application Ser. No. 16/233,907 filed on Dec. 27, 2018, which claims benefits of priority of Korean Patent Application No. 10-2018-0116441 filed on Sep. 28, 2018. The disclosure of each of the foregoing application is incorporated herein by reference in its entirety.

BACKGROUND

1. Field

The present invention relates generally to a semiconductor device. More particularly, the present invention relates to a semiconductor device including a sacrificial layer for inhibiting the reduction (opposite of oxidation) of dielectric layer and a method for fabricating the semiconductor device.

2. Description of the Related Art

A capacitor of a semiconductor device may include a bottom electrode, a dielectric layer, and a top electrode. As the degree of integration of a semiconductor device increases, the thickness of the dielectric layer decreases, which may increase leakage current. Increasing the physical thickness of the dielectric layer to reduce the leakage current leads to an increase in an equivalent oxide thickness ($T_{ox}$).

SUMMARY

Exemplary embodiments of the present invention are directed to a semiconductor device that may prevent a reduction of a dielectric layer, and a method for fabricating the semiconductor device.

Exemplary embodiments are directed to a capacitor that may prevent a reduction of a high-k material, and a method for fabricating the capacitor.

In accordance with an embodiment of the present invention, a semiconductor device includes: a dielectric layer; a conductive layer formed over the dielectric layer; and a reduction sacrificial layer formed between the dielectric layer and the conductive layer, wherein the reduction sacrificial layer includes: a first reduction sacrificial material having higher electronegativity than the dielectric layer; and a second reduction sacrificial material having higher electronegativity than the first reduction sacrificial material.

In accordance with an embodiment of the present invention, a capacitor includes: a bottom electrode; a dielectric layer formed over the bottom electrode; a top electrode formed over the dielectric layer; and a reduction sacrificial layer formed between the dielectric layer and the top electrode, wherein the reduction sacrificial layer includes: a first reduction sacrificial material having higher electronegativity than the dielectric layer; and a second reduction sacrificial material having higher electronegativity than the first reduction sacrificial material. The reduction sacrificial layer includes a stack structure in which the first reduction sacrificial material and the second reduction sacrificial material are stacked, and the second reduction sacrificial material contacted with the top electrode or the dielectric layer. The reduction sacrificial layer includes a laminate structure in which the first reduction sacrificial material and the second reduction sacrificial material are alternately stacked, and the second reduction sacrificial material contacted with the top electrode or the dielectric layer. The reduction sacrificial layer includes a structure in which the first reduction sacrificial material and the second reduction sacrificial material are intermixed. The dielectric layer includes a zirconium oxide-based layer or a hafnium oxide-based layer, and the first reduction sacrificial material and the second reduction sacrificial material include a material having higher electronegativity than the zirconium oxide-based layer and the hafnium oxide-based layer. Each of the first reduction sacrificial material and the second reduction sacrificial material includes titanium oxide, tantalum oxide, aluminum oxide, tin oxide, niobium oxide, germanium oxide, silicon oxide, molybdenum oxide, ruthenium oxide, iridium oxide or combinations thereof, and the first reduction sacrificial material and the second reduction sacrificial material are different from each other. The first reduction sacrificial material includes titanium oxide or tantalum oxide, and the second reduction sacrificial material includes aluminum oxide, tin oxide, niobium oxide, germanium oxide, silicon oxide, molybdenum oxide, ruthenium oxide, iridium oxide or combinations thereof. Each of the first reduction sacrificial material and the second reduction sacrificial material includes one suboxide of materials selected from titanium, tantalum, aluminum, tin, molybdenum, ruthenium, iridium, niobium, germanium, silicon and combinations thereof, and the first reduction sacrificial material and the second reduction sacrificial material are different from each other. The capacitor further comprising an interface control layer between the bottom electrode and the dielectric layer. The interface control layer and the reduction sacrificial layer include the same material, and include a material having higher electronegativity than the dielectric layer. The interface control layer and the reduction sacrificial layer include different materials, and include a material having higher electronegativity than the dielectric layer. The reduction sacrificial layer is thinner than the dielectric layer. The reduction sacrificial layer may include a conductive metal oxide.

In accordance with an embodiment of the present invention, a method for fabricating a capacitor includes: forming a dielectric layer over a bottom electrode; forming a reduction sacrificial layer over the dielectric layer, the reduction sacrificial layer including a first reduction sacrificial material having higher electronegativity than the dielectric layer and a second reduction sacrificial material having higher electronegativity than the first reduction sacrificial material; and forming a top electrode over the reduction sacrificial layer in a reducing atmosphere. The forming of the reduction sacrificial layer includes forming a stack structure in which the first reduction sacrificial material and the second reduction sacrificial material are stacked, wherein the second reduction sacrificial material contacted with the top electrode or the dielectric layer. The forming of the reduction sacrificial layer includes forming a laminate structure in which the first reduction sacrificial material and the second reduction sacrificial material are alternately stacked, wherein the second reduction sacrificial material contacted with the top electrode or the dielectric layer. The forming of the reduction sacrificial layer includes forming a structure in which the first reduction sacrificial material and the second reduction sacrificial material are intermixed. Each of the first reduction sacrificial material and the second reduction sacrificial material includes titanium, tantalum, aluminum, tin, molybdenum, ruthenium, iridium, niobium, germanium, silicon or combinations thereof. Each of the first reduction sacrificial material and the second reduction sacrificial material includes on oxide of materials selected from titanium, tantalum, aluminum, tin, molybdenum, ruthenium, iridium, niobium, germanium, silicon and combinations thereof. Each of the first reduction sacrificial material and the second reduction sacrificial material includes one suboxide of materials selected from titanium, tantalum, aluminum, tin, molybdenum, ruthenium, iridium, niobium, germanium, silicon and combinations thereof. The method further comprising forming an interface control layer over the bottom electrode, the interface control layer having higher electronegativity than the dielectric layer, prior to the forming of the dielectric layer. The interface control layer and the reduction sacrificial layer include the same material, and include a material having higher electronegativity than the dielectric layer. The method further comprising performing an anneal process for reducing the reduction sacrificial layer prior to the forming of the top electrode. The anneal process is performed by laser anneal, plasma oxidation or plasma nitridation or performed in $NH_3$ atmosphere. The dielectric layer includes a zirconium oxide-based layer or a hafnium oxide-based layer. The reduction sacrificial layer may include a dielectric metal oxide or a conductive metal oxide which could be conductive after losing oxygen during the forming of top electrode in reduction atmosphere.

These and other features and advantages of the present invention will become apparent to those skilled in the art to which the present invention belongs from the following detailed description in conjunction with the accompanying drawings.

DETAILED DESCRIPTION

Figure 1A:
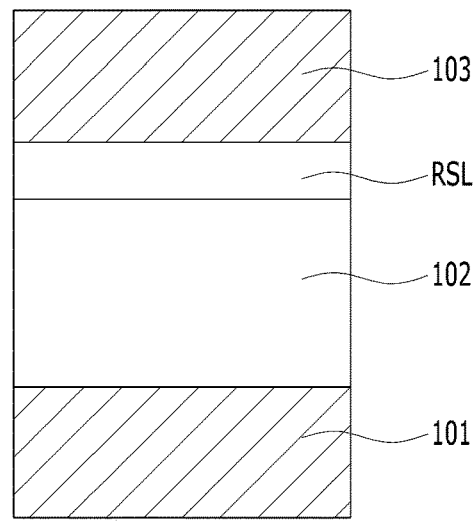
FIG. 1A is a cross-sectional view of a semiconductor device in accordance with an embodiment of the present invention.

Exemplary embodiments described herein will be described with reference to cross-sectional views, plan views and block diagrams, which are ideal schematic views of the present invention. Thus, the structures of the drawings may be modified by fabricating techniques and/or tolerances. The embodiments of the present invention are not limited to the specific structures shown in drawings, but include any changes in the structures that may be produced according to the fabricating process. Accordingly, the regions illustrated in the drawings have schematic attributes, and the shapes of the regions illustrated in the drawings are intended to illustrate specific structures of regions of the elements, and are not intended to limit the scope of the invention.

A capacitor may include a bottom electrode, a dielectric layer, and a top electrode. As the thickness of the dielectric layer decreases, leakage current may increase. There is trade-off relationship between a dielectric constant and an energy bandgap of dielectric. In order to suppress the leakage current according to the scaling down the equivalent oxide thickness ($T_{ox}$), the thicker dielectric layer may be required or a dielectric layer having a large bandgap may be used for higher barrier height. An increase in the thickness of the dielectric layer and the low dielectric constant of the dielectric layer may increase the electrical thickness of the dielectric layer, that is, an equivalent oxide thickness ($T_{ox}$). When the thickness of the dielectric layer is decreased to scale down the $T_{ox}$, the decreased thickness of the dielectric layer becomes smaller than the minimum thickness necessary for crystallization of the dielectric layer, thereby increasing the amorphous characteristic. Therefore, although the thickness of the dielectric layer is reduced, there is limitation in an increase of capacitance.

In addition, the top electrode of the capacitor may be formed in a strong reducing atmosphere. For example, the strong reducing atmosphere may include gases such as $NH_3$, $SiH_x$, $GeH_x$ and $BH_x$. Since the strong reducing atmosphere causes a loss of oxygen in the dielectric layer, the quality of the dielectric layer may be lowered.

A dead layer (DL) having a low dielectric constant may be form at the interface between the dielectric layer and the top electrode. The DL may be formed in a reducing atmosphere when the top electrode is deposited. Further, the DL may be formed due to oxidation of the top electrode. The DL may serve as an obstacle to lowering the $T_{ox}$.

Hereinafter, embodiments are directed to interfacial engineering that may prevent the reduction of the dielectric layer. In addition, embodiments are directed to interfacial engineering that may prevent the deterioration of the dielectric constant of the dielectric layer. Furthermore, embodiments are directed to interfacial engineering that may reduce the leakage current.

In embodiments, which are to be described below, a reduction sacrificial layer (RSL) may be formed at the interface between a dielectric layer and a conductive layer. The RSL may be a material that is reduced prior to the dielectric layer. The RSL may be a conductive material. The RSL may prevent interfacial oxidation between the dielectric layer and the conductive layer without acting as a dielectric layer. When the RSL is reduced, the RSL may serve as a leakage current barrier with a large effective work function (eWF) and a large conduction band offset (CBO). In addition, the RSL may not increase the $T_{ox}$. The RSL may be a material having high electronegativity.

As described above, according to an embodiment of the present invention, including an RSL can improve the interfacial characteristics between the dielectric layer and the top electrode. The inclusion of the RSL may prevent the formation of the DL. The RSL may be reduced instead of the dielectric layer, and thus prevent reduction of the dielectric layer. In addition, although the RSL is reduced, the RSL having conductivity increases the eWF and the CBO of the top electrode without acting as a dielectric layer.

The RSL may have higher Pauling electronegativity than the dielectric layer 102. The RSL may include a material having higher Pauling electronegativity (hereinafter abbreviated as "electronegativity") than zirconium oxide ($ZrO_2$) and hafnium oxide ($HfO_2$). When the electronegativity is high, the RSL may be difficult to oxidize and easy to reduce. Therefore, the RSL may lose oxygen on behalf of the dielectric layer. As a result, the RSL may prevent an oxygen loss of the dielectric layer. Thus, the oxygen in the dielectric layer may be maintained without loss during deposition of the top electrode under reduction atmosphere.

The RSL may include a reduction sacrificial material. The reduction sacrificial material may include a material having high electronegativity. The reduction sacrificial material may include an atom having high electronegativity, for example, a metal atom, a silicon atom, or a germanium atom. The reduction sacrificial material may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof.

TABLE 1

| Element | Hf | Zr |
|---|---|---|
| EN(Pauling) | 1.3 | 1.33 |
| Oxide | $HfO_2$ | $ZrO_2$ |

TABLE 2

| Element | Ta | Ti | Nb | Al | Si | Sn | Ge | Mo | Ir | Ru |
|---|---|---|---|---|---|---|---|---|---|---|
| EN (Pauling) | 1.50 | 1.54 | 1.60 | 1.61 | 1.90 | 1.96 | 2.01 | 2.16 | 2.20 | 2.20 |
| Oxide | $Ta_2O_5$ | $TiO_2$ | $Nb_2O_5$ | $Al_2O_3$ | $SiO_2$ | $SnO_2$ | $GeO_2$ | $MoO_2$, $MoO_3$ | $IrO_2$ | $RuO_2$ |

In Table 1 and Table 2, 'Element' refers to an atom, 'EN' refers to electronegativity, and 'Oxide' refers to the oxide of the atom.

Table 1 shows the electronegativities of exemplary materials that may be included in the dielectric layer. Table 2 shows the electronegativities of exemplary reduction sacrificial materials that may be included in the RSL. The dielectric layer and the reduction sacrificial material are not limited to the materials shown in Table 1 and Table 2.

Referring to Table 1, hafnium (Hf) has an electronegativity of 1.3 and zirconium (Zr) has an electronegativity of 1.33.

Referring to Table 2, the exemplary reduction sacrificial materials may have an electronegativity of approximately 1.5 to 2.2. The reduction sacrificial materials may have higher electronegativity than the materials that may be included in the dielectric layer, for example, Hf and Zr.

The RSL may include an oxide of the reduction sacrificial material. For example, the RSL may include tantalum oxide ($Ta_2O_5$), titanium oxide ($TiO_2$), niobium oxide ($Nb_2O_5$), aluminum oxide ($Al_2O_3$), silicon oxide ($SiO_2$), tin oxide ($SnO_2$), germanium oxide ($GeO_2$), molybdenum dioxide ($MoO_2$), molybdenum trioxide ($MoO_3$), iridium oxide ($IrO_2$), ruthenium oxide ($RuO_2$) or combinations thereof.

The RSL may include a single structure, a stack structure, a laminated structure, an intermixing structure, or combinations thereof. The single structure may include a single layer of a reduction sacrificial material. The stack structure may be a stacked structure of reduction sacrificial materials having different electronegativities. The laminate structure may include reduction sacrificial materials having different electronegativities and laminated at a small thickness. The intermixing structure may include reduction sacrificial materials having different electronegativities and intermixed therein.

In the stack structure, the laminate structure and the intermixing structure, the reduction sacrificial materials having different electronegativities may include a first reduction sacrificial material and a second reduction sacrificial material. The first reduction sacrificial material may have first electronegativity, and the second reduction sacrificial material may have second electronegativity. The first electronegativity and the second electronegativity may have different electronegativities. For example, the second electronegativity may be higher than the first electronegativity. The second reduction sacrificial material may have higher electronegativity than the first reduction sacrificial material.

In some embodiments, the second reduction sacrificial material may be exposed to the reducing atmosphere earlier than the first reduction sacrificial material. Thus, the second reduction sacrificial material prefers to lose oxygen than first reduction sacrificial material.

In some embodiments, the first reduction sacrificial material may be exposed to the reducing atmosphere earlier than the second reduction sacrificial material. In this case, although the first reduction sacrificial material having low electronegativity is reduced earlier than the second reduction sacrificial material, the reduction of the dielectric layer may be prevented by the second reduction sacrificial material.

The first reduction sacrificial material and the second reduction sacrificial material may have higher electronegativity than the materials that may be included in the dielectric layer. Each of the first reduction sacrificial material and the second reduction sacrificial material may include titanium (Ti), tantalum (Ta), niobium (Nb), aluminum (Al), silicon (Si), tin (Sn), germanium (Mo), ruthenium (Ru), iridium (Ir) or combinations thereof. The first reduction sacrificial material and the second reduction sacrificial material may be different materials. Each of the first reduction sacrificial material and the second reduction sacrificial material may include tantalum oxide ($Ta_2O_5$), titanium oxide ($TiO_2$), niobium oxide ($Nb_2O_5$), aluminum oxide ($Al_2O_3$), silicon oxide ($SiO_2$), tin oxide ($SnO_2$), germanium oxide ($GeO_2$), molybdenum dioxide ($MoO_2$), molybdenum trioxide ($MoO_3$), iridium oxide ($IrO_2$), ruthenium oxide ($RuO_2$) or combinations thereof. The first reduction sacrificial material and the second reduction sacrificial material may be different materials.

The first reduction sacrificial material and the second reduction sacrificial material may control an effective work function (eWF) by the difference in electronegativity.

The first reduction sacrificial material and the second reduction sacrificial material may have a difference in areal oxygen density therebetween. The difference in areal oxygen density may induce an interface dipole to control the effective work function (eWF) and the conduction band offset (CBO).

FIG. 1A is a cross-sectional view of a semiconductor device 111 in accordance with an embodiment of the present invention.

Referring to FIG. 1A, the semiconductor device 111 may include a first conductive layer 101, a dielectric layer 102, and a second conductive layer 103. The semiconductor device 111 may further include a reduction sacrificial layer RSL disposed between the dielectric layer 102 and the second conductive layer 103. The reduction sacrificial layer RSL may be in direct contact with both the dielectric layer 102 and the second conductive layer 103.

Suitable materials for the first conductive layer 101 may include a metal-containing material. For example, the first conductive layer 101 may include a metal, a metal nitride, a conductive metal oxide or combinations thereof. In some embodiments, he first conductive layer 101 may include titanium (Ti), titanium nitride (TIN), tantalum nitride (TaN), tungsten (W), tungsten nitride (WN), ruthenium (Ru), iridium (Ir), ruthenium oxide ($RuO_2$), iridium oxide ($IrO_2$) or combinations thereof. In some embodiments, the first conductive layer 101 may include a silicon-containing material. For example, the first conductive layer 101 may include a silicon (Si) substrate, a silicon layer, a silicon germanium (SiGe) layer or combinations thereof. The first conductive layer 101 may also be referred to as a "bottom conductive layer". In some embodiments, the first conductive layer 101 may include a stack structure of a metal-containing material and a silicon-containing material.

Suitable materials for the second conductive layer 103 may include a silicon-containing material, a germanium-containing material, a metal-containing material or any combinations thereof. For example, the second conductive layer 103 may include a metal, a metal nitride, a metal carbide, a conductive metal nitride or any combinations thereof. In some embodiments, the second conductive layer 103 may include titanium (Ti), titanium nitride (TIN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$) or any combinations thereof. In some embodiments, the second conductive layer 103 may include a silicon (Si) layer, a germanium (Ge) layer, a silicon germanium (SiGe) layer or any combinations thereof. In some embodiments, the second conductive layer 103 may have a multilayer structure (Si/SiGe) formed by stacking the silicon germanium layer on the silicon layer. In some embodiments, the second conductive layer 103 may have a multilayer structure (Ge/SiGe) formed by stacking the silicon germanium layer on the germanium layer. In some embodiments, the second conductive layer 103 may be formed by stacking the silicon germanium layer and the metal nitride. For example, the second conductive layer 103 may have a multilayer structure (SiGe/TiN) formed by stacking the silicon germanium layer on the titanium nitride. The second conductive layer 103 may also be referred to as a "top conductive layer".

The dielectric layer 102 may have a single-layer structure, a multilayer structure, a laminate structure, a doping structure or an intermixing structure. The dielectric layer 102 may be in direct contact with the first conductive layer 101. The dielectric layer 102 may include a high-k material. The dielectric layer 102 may have a higher dielectric constant than silicon oxide ($SiO_2$). The silicon oxide may have a dielectric constant of approximately 3.9. The dielectric layer 102 may include a material having a dielectric constant of approximately 4 or higher. The high-k material may have a dielectric constant of approximately 20 or higher. Suitable high-k materials may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). In some embodiments, the dielectric layer 102 may be a composite layer including two or more of the above-described high-k materials. In some embodiments, the dielectric layer 102 may be formed of zirconium (Zr)-based oxide. For example, the dielectric layer 102 may have a stack structure including zirconium oxide ($ZrO_2$). In some embodiments, the stack structure including the zirconium oxide ($ZrO_2$) may include a ZA ($ZrO_2/Al_2O_3$) structure in which aluminum oxide is stacked on zirconium oxide, or a ZAZ ($ZrO_2/Al_2O_3/ZrO_2$) structure in which zirconium oxide, aluminum oxide and zirconium oxide are sequentially stacked. Each of $ZrO_2$, the ZA and ZAZ structures may also be referred to as a "zirconium oxide ($ZrO_2$)-based layer". In some embodiments, the dielectric layer 102 may be formed of hafnium (Hf)-based oxide. For example, the dielectric layer 102 may have a stack structure including hafnium oxide ($HfO_2$). For example, the stack structure including the hafnium oxide ($HfO_2$) may include a HA ($HfO_2/Al_2O_3$) structure in which aluminum oxide is stacked on hafnium oxide, or a HAH ($HfO_2/Al_2O_3/HfO_2$) structure in which hafnium oxide, aluminum oxide and hafnium oxide are sequentially stacked. Each of the $HfO_2$, the HA and HAH structures may also be referred to as a "hafnium oxide ($HfO_2$)-based layer".

The aluminum oxide $Al_2O_3$ in the ZA, ZAZ, HA and HAH structures may have a higher bandgap than the zirconium oxide ($ZrO_2$) and the hafnium oxide ($HfO_2$). The aluminum oxide ($Al_2O_3$) may have a dielectric constant that is lower than the dielectric constants of the zirconium oxide ($ZrO_2$) and the hafnium oxide ($HfO_2$). Accordingly, the dielectric layer 102 may include a stack of a high-k material and a high bandgap material having a higher bandgap than the high-k material. In some embodiments, the dielectric layer 102 may include silicon oxide $SiO_2$ as a high bandgap material instead of aluminum oxide. The dielectric layer 102 including a high bandgap material may suppress leakage current. The high bandgap material may be ultra-thin. The high bandgap material may be thinner than the high-k material.

In some embodiments, the dielectric layer 102 may include a laminate structure in which the high-k material and the high bandgap material are alternately stacked. For example, the laminate structure may include a ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$) structure. In the laminate structure, aluminum oxide ($Al_2O_3$) may be ultra-thin.

A top surface of the reduction sacrificial layer RSL may be in direct contact with a bottom surface of the second conductive layer 103. A bottom surface of the reduction sacrificial layer RSL may be in direct contact with a top surface of the dielectric layer 102.

Suitable materials for the reduction sacrificial layer RSL may include materials having high electronegativity (EN). For example, the reduction sacrificial layer RSL may include a material having higher electronegativity (EN) than the dielectric layer 102. The reduction sacrificial layer RSL may include a material having a high band gap. The reduction sacrificial layer RSL may prevent reduction of the dielectric layer 102 when the second conductive layer 103 is formed. The reduction sacrificial layer RSL may include a material that is reduced earlier than the dielectric layer 102. The reduction sacrificial layer RSL may include a material that is easier to reduce than the dielectric layer 102. The reduction sacrificial layer RSL may include a reduction sacrificial material. The reduction sacrificial material may include a material having high electronegativity. The reduction sacrificial material may include an atom having high electronegativity, for example, a metal atom, a silicon atom or a germanium atom. The reduction sacrificial material may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof.

The reduction sacrificial layer RSL may include an oxide of the reduction sacrificial material. The reduction sacrificial layer RSL may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof.

The reduction sacrificial layer RSL may be reduced to a suboxide. The suboxide may have an insulative, semiconductive or conductive property.

In some embodiments, the reduction sacrificial layer RSL may include an oxide that has high electronegativity and is easy to reduce. The oxide may be reduced and modified to suboxide. The suboxide may be more oxygen-deficient than the oxide. The suboxide may include a suboxide of a reduction sacrificial material. The reduction sacrificial material may include any one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof. The suboxide may include titanium suboxide, tantalum suboxide, tin suboxide, molybdenum suboxide, ruthenium suboxide, iridium suboxide, niobium suboxide, germanium suboxide, aluminum suboxide, silicon suboxide or combinations thereof. The titanium suboxide may include $TiO_{2-x}$ (x<2) or $Ti_4O_7$. The tantalum suboxide may include $Ta_2O_{5-x}$ (x<5). The aluminum suboxide may include $Al_2O_3$, (x<3). The tin suboxide may include SnO or $SnO_{2-x}$ (x<2). The molybdenum suboxide may include $MoO_2$, $MoO_{2-x}$ (x<2) and $MoO_{3-x}$ (x<3). The ruthenium suboxide may include $RuO_{2-x}$ (x<2). The iridium suboxide may include $IrO_{2-x}$ (x<2). The niobium suboxide may include $Nb_2O_{5-x}$ (x<5), $NbO_2$ or NbO. The germanium suboxide may include GeO or $GeO_{2-x}$ (x<2). The silicon suboxide may include $SiO_{2-x}$ (x<2). $Ta_2O_{5-x}$(x<5), $TiO_{2-x}$ (x<2), $Ti_4O_7$, NbO, SnO, $SnO_{2-x}$ (x<2), $MoO_2$, $MoO_{2-x}$ (x<2), $MoO_{3-x}$ (x<3), $RuO_{2-x}$ (x<2) and $IrO_{2-x}$ (x<2) may be conductive suboxides. $Nb_2O_{5-x}$ (x<5) and $NbO_2$ may be semiconductive suboxides. $Al_2O_{3-x}$ (x<3), $SiO_{2-x}$ (x<2), GeO and $GeO_{2-x}$ (x<2) may be insulative suboxides.

The reduction sacrificial layer RSL may include a metal oxide or a conductive metal suboxide. The metal oxide may be reduced (lose oxygen) and then modified to a conductive metal suboxide. The conductive metal suboxide may be more oxygen-deficient than the metal oxide. The lower oxygen content in the reduction sacrificial layer RSL may further increase the conductivity of the reduction sacrificial layer RSL and have a higher effective work function. For example, $Nb_2O_{5-x}$ may be conductive even though $Nb_2O_5$ is an insulator. The conductive metal suboxide may include titanium suboxide, tantalum suboxide, tin suboxide, molybdenum suboxide, ruthenium suboxide, iridium suboxide, niobium suboxide or combinations thereof. The conductive metal suboxide may not affect the $T_{ox}$ of the dielectric layer 102. The conductive metal suboxide may be used as a conductive material together with the second conductive layer 103.

The tin suboxide, the molybdenum suboxide, the ruthenium suboxide and the iridium suboxide may have a high workfunction of approximately 5 eV or higher. The reduction sacrificial layer RSL having a high work function may reduce the leakage current.

The aluminum suboxide and the silicon suboxide may have a high bandgap of approximately 8 eV or higher. The reduction sacrificial layer RSL having a high bandgap may reduce the leakage current.

The reduction sacrificial layer RSL may be ultra-thin. The reduction sacrificial layer RSL may be thinner than the dielectric layer 102. For example, the reduction sacrificial layer RSL may have a thickness of approximately 2 nm or less. The ultra-thin reduction sacrificial layer RSL may not affect the $T_{ox}$ of the dielectric layer 102. In addition, the ultra-thin conductive reduction sacrificial layer RSL may not affect the $T_{ox}$ of the dielectric layer 102.

Figure 1B:
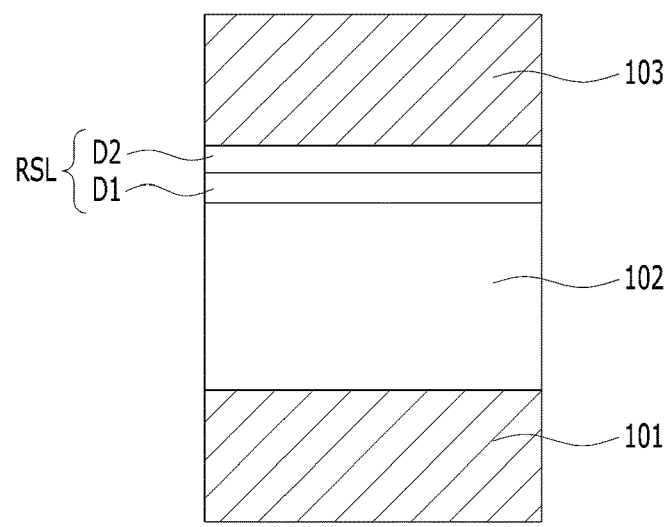
FIGS. 1B to 1D are cross-sectional views illustrating semiconductor devices in accordance with modifications of FIG. 1A.

FIG. 1B is a cross-sectional view illustrating a semiconductor device in accordance with a modification of the semiconductor device shown in FIG. 1A.

Referring to FIG. 1B, the semiconductor device 112 may include a reduction sacrificial layer RSL. The reduction sacrificial layer RSL may include a material that is easier to reduce than the dielectric layer 102. The reduction sacrificial layer RSL may have higher electronegativity than the dielectric layer 102. The reduction sacrificial layer RSL may include a low concentration region D1 and a high concentration region D2. The low concentration region D1 and the high concentration region D2 may include reduction sacrificial materials having different concentrations. The concentration of the reduction sacrificial material in the high concentration region D2 may be greater than that in the low concentration region D1. The low concentration region D1 and the high concentration region D2 may include the same reduction sacrificial material, and the concentration of the reduction sacrificial material in the high concentration region D2 may be greater than that in the low concentration region D1. The high concentration region D2 may be in direct contact with the second conductive layer 103, and the low concentration region D1 may be in direct contact with the dielectric layer 102. In some embodiments, the high concentration region D2 may be in direct contact with the dielectric layer 102, and the low concentration region D1 may be in direct contact with the second conductive layer 103.

The low concentration region D1 and the high concentration region D2 may include the reduction sacrifice material having high electronegativity. The low concentration region D1 and the high concentration region D2 may include titanium (Ti), tantalum (Ta), aluminum (Al), tin (Sn), molybdenum (Mo), ruthenium (Ru), iridium (Ir), germanium (Ge), silicon (Si) or combinations thereof.

The low concentration region D1 and the high concentration region D2 may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. The low concentration region D1 and the high concentration region D2 may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

For example, the low concentration region D1 and the high concentration region D2 may include the titanium oxide ($TiO_2$), and the high concentration region D2 may have a higher concentration of titanium than the low concentration region D1. For example, the high concentration region D2 may include Ti-rich titanium oxide (Ti-rich $TiO_2$).

Figure 1C:
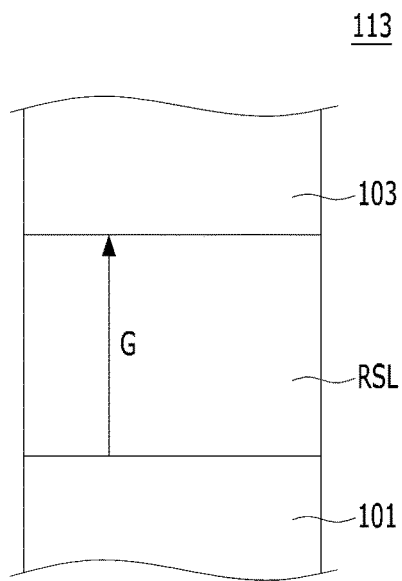

Referring to FIG. 1C illustrating another modification of FIG. 1A, a semiconductor device 113 may include a reduction sacrificial layer RSL. The reduction sacrificial layer RSL may include a material that is easier to reduce than the dielectric layer 102. The reduction sacrificial layer RSL may have higher electronegativity than the dielectric layer 102. The reduction sacrificial layer RSL may include a reduction sacrificial material having high electronegativity. The concentration of the reduction sacrificial material in the reduction sacrificial layer RSL may be graded (that is, "G" in the drawing). The concentration of the reduction sacrificial material may be the smallest in a portion contacting the dielectric layer 102, and the greatest in a portion contacting the second conductive layer 103. The farther away from the dielectric layer 102, that is, the closer to the second conductive layer 103, the greater the concentration of the reduction sacrificial material.

In some embodiments, the concentration of the reduction sacrificial material may be the greatest in the portion contacting the dielectric layer 102, and the smallest in the portion contacting the second conductive layer 103.

Figure 1D:
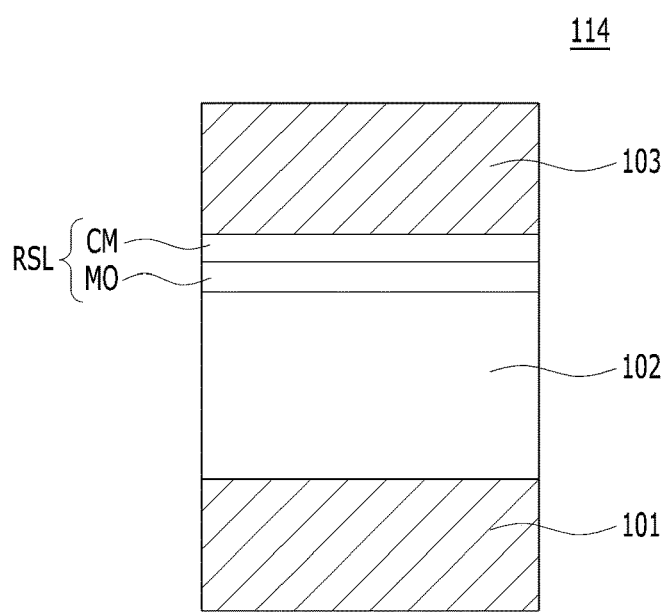

Referring to FIG. 1D illustrating still another modification of FIG. 1A, a semiconductor device 114 may include a reduction sacrificial layer RSL. The reduction sacrificial layer RSL may include a material that is easier to reduce than the dielectric layer 102. The reduction sacrificial layer RSL may have higher electronegativity than the dielectric layer 102. The reduction sacrificial layer RSL may include a reduction sacrificial material having high electronegativity. The reduction sacrificial layer RSL may include a metal oxide MO and a conductive metal suboxide CM. The metal oxide MO and the conductive metal suboxide CM may include a reduction sacrificial material having high electronegativity. The metal oxide MO may be in direct contact with the dielectric layer 102, and the conductive metal suboxide CM may be in direct contact with the second conductive layer 103. In some embodiments, the metal oxide MO may be in direct contact with the second conductive layer 103, and the conductive metal suboxide CM may be in direct contact with the dielectric layer 102.

The metal oxide MO may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$) or combinations thereof.

The conductive metal suboxide CM may include titanium suboxide, tantalum suboxide, aluminum suboxide, tin suboxide, molybdenum suboxide, molybdenum suboxide, ruthenium suboxide, iridium suboxide, niobium suboxide or combinations thereof. The conductive metal suboxide CM may be more oxygen-deficient than the metal oxide MO.

In some embodiments, the reduction sacrificial layer RSL may include a stack, laminate or intermixing structure of metal oxides MO having different electronegativities.

In some embodiments, the reduction sacrificial layer RSL may include a stack, laminate or intermixing structure of conductive metal suboxides CM having different electronegativities.

Figure 2:
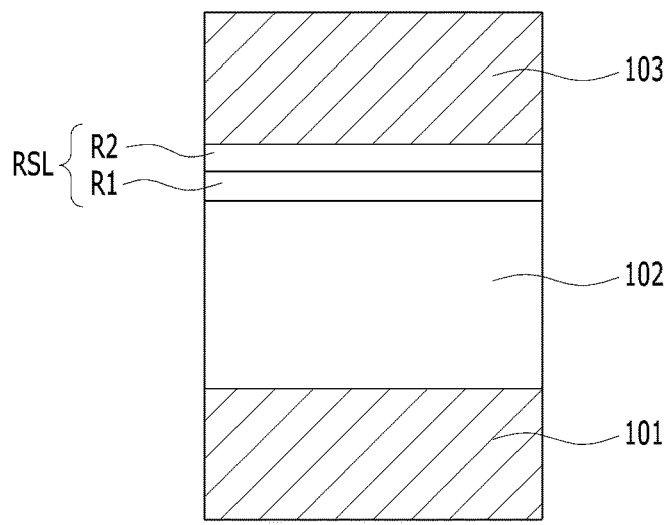
FIGS. 2 to 5D are cross-sectional views of a semiconductor device in accordance with an embodiment of the present invention.

FIG. 2 is a cross-sectional view of a semiconductor device in accordance with an embodiment of the present invention.

Referring to FIG. 2, the semiconductor device 121 may include a first conductive layer 101, a dielectric layer 102, and a second conductive layer 103. The semiconductor device 121 may further include a reduction sacrificial layer RSL disposed between the dielectric layer 102 and the second conductive layer 103. The reduction sacrificial layer RSL may include a material having higher electronegativity than the dielectric layer 102. The reduction sacrificial layer RSL may include a material that is reduced earlier than the dielectric layer 102. The reduction sacrificial layer RSL may include a first reduction sacrificial material R1 and a second reduction sacrificial material R2. The second reduction sacrificial material R2 may be stacked on the first reduction sacrificial material R1. A bottom surface of the first reduction sacrificial material R1 may be in direct contact with a top surface of the dielectric layer 102. A top surface of the second reduction sacrificial material R2 may be in direct contact with a bottom surface of the second conductive layer 103.

Each of the first and second reduction sacrificial materials R1 and R2 may include a material having high electronegativity. The second reduction sacrificial material R2 may prevent reduction of the dielectric layer 102 when the second conductive layer 103 is formed. Each of the first and second reduction sacrificial materials R1 and R2 may include a material having higher electronegativity than the dielectric layer 102. Each of the first and second reduction sacrificial materials R1 and R2 may include a material that is reduced earlier than the dielectric layer 102. Each of the first and second reduction sacrificial materials R1 and R2 may include a material that is easier to reduce than the dielectric layer 102. Each of the first and second reduction sacrificial materials R1 and R2 may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof.

Each of the first and second reduction sacrificial materials R1 and R2 may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. In some embodiments, each of the first and second reduction sacrificial materials R1 and R2 may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof. The first and second reduction sacrificial materials R1 and R2 may include a dielectric metal oxide or a conductive metal oxide. The first and second reduction sacrificial materials R1 and R2 may be conductive after losing oxygen during the deposition of the second conductive layer 103 in reduction atmosphere.

The first and second reduction sacrificial materials R1 and R2 may be the same material or different materials. The second reduction sacrificial material R2 may be a material that is easier to reduce than the first reduction sacrificial material R1. The electronegativity of the second reduction sacrificial material R2 contacting the second conductive layer 103 may be the highest. The electronegativity of the second reduction sacrificial material R2 may be higher than that of the first reduction sacrificial material R1. Thus, the second reduction sacrificial material R2 prefers to lose oxygen than the first reduction sacrificial material R1.

In some embodiments, the first reduction sacrificial material R1 may be in direct contact with the second conductive layer 103, and the second reduction sacrificial material R2 may be in direct contact with the dielectric layer 102.

The total thickness of the reduction sacrificial layer RSL may be approximately 2 nm or less, and each of the first reduction sacrificial material R1 and the second reduction sacrificial material R2 may have a thickness of approximately 1 nm or less. In some embodiments, the second reduction sacrificial material R2 may be thicker than the first reduction sacrificial material R1.

Figure 3:
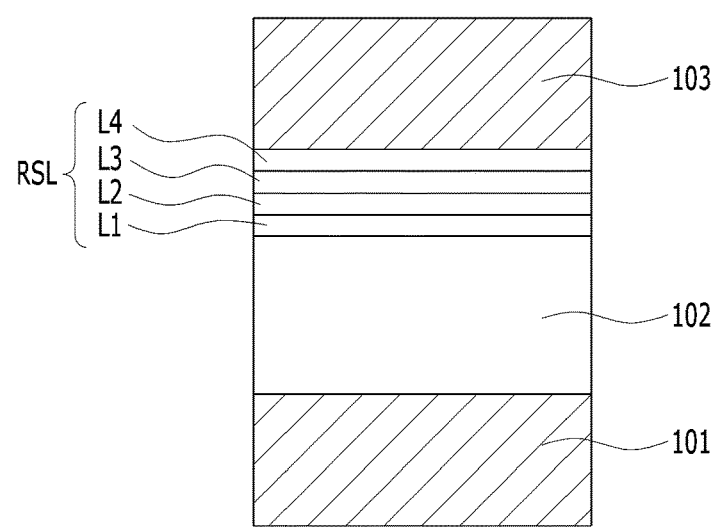

FIG. 3 is a cross-sectional view of a semiconductor device in accordance with an embodiment of the present invention.

Referring to FIG. 3, the semiconductor device 131 may include a first conductive layer 101, a dielectric layer 102, and a second conductive layer 103. The semiconductor device 131 may further include a reduction sacrificial layer RSL disposed between the dielectric layer 102 and the second conductive layer 103. The reduction sacrificial layer RSL may include a plurality of laminated layers. For example, the reduction sacrificial layer RSL may have a structure in which a first laminated layer L1, a second laminated layer L2, a third laminated layer L3 and a fourth laminated layer L4 are sequentially stacked. A bottom surface of the first laminated layer L1 may be in direct contact with a top surface of the dielectric layer 102. A top surface of the fourth laminated layer L4 may be in direct contact with a bottom surface of the second conductive layer 103.

Each of the first laminated layer L1, the second laminated layer L2, the third laminated layer L3 and the fourth laminated layer L4 may include a material having high electronegativity (EN). Each of the first laminated layer L1, the second laminated layer L2, the third laminated layer L3 and the fourth laminated layer L4 may prevent reduction of the dielectric layer 102 when the second conductive layer 103 is formed. Each of the first laminated layer L1, the second laminated layer L2, the third laminated layer L3 and the fourth laminated layer L4 may include a material that is reduced earlier than the dielectric layer 102. Each of the first laminated layer L1, the second laminated layer L2, the third laminated layer L3 and the fourth laminated layer L4 may be easier to reduce than the dielectric layer 102. Each of the first laminated layer L1, the second laminated layer L2, the third laminated layer L3 and the fourth laminated layer L4 may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof.

Each of the first laminated layer L1, the second laminated layer L2, the third laminated layer L3 and the fourth laminated layer L4 may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. Each of the first laminated layer L1, the second laminated layer L2, the third laminated layer L3 and the fourth laminated layer L4 may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

Each of the first laminated layer L1, the second laminated layer L2, the third laminated layer L3 and the fourth laminated layer L4 may include a material that is easier to reduce as far as away from the dielectric layer 102. That is, the electronegativity of the fourth laminated layer L4 contacting the second conductive layer 103 may be the highest. For example, the fourth laminated layer L4 may be a material that is easier to reduce than the first to the third laminated layers L1 to L3. The first laminated layer L1 may include a material that is easier to reduce than the dielectric layer 102. The second laminated layer L2 may be easier to reduce than the first laminated layer L1 and the dielectric layer 102. The third laminated layer L3 may be easier to reduce than the dielectric layer 102, the first laminated layer L1 and the second laminated layer L2. The fourth laminated layer L4 may be easier to reduce than the dielectric layer 102, the first laminated layer L1, the second laminated layer L2 and the third laminated layer L3.

In some embodiments, the first laminated layer L1, the second laminated layer L2 and the third laminated layer L3 may have the same first electronegativity, and the fourth laminated layer L4 may have second electronegativity higher than the first electronegativity.

In some embodiments, the first laminated layer L1, the second laminated layer L2, the third laminated layer L3 and the fourth laminated layer L4 may have different electronegativities. In some embodiments, the electronegativity of the first to fourth laminated layers L1 to L2 may increase as the distance from the dielectric layer 102 increases.

In some embodiments, the first laminated layer L1 and the third laminated layer L3 may have the same first electronegativity, and the second laminated layer L2 and the fourth laminated layer L4 may have the same second electronegativity. Herein, the second electronegativity may be higher than the first electronegativity. The first laminated layer L1 and the third laminated layer L3 may be a first reduction sacrificial material R1, and the second laminated layer L2 and the fourth laminated layer L4 may be a second reduction sacrificial material R2. Therefore, the reduction sacrificial layer RSL may have a laminate structure formed by alternately stacking the first reduction sacrificial material R1 and the second reduction sacrificial material R2, wherein the second reduction sacrificial material R2 may be in direct contact with the second conductive layer 103.

In some embodiments, each of the first laminated layer L1, the second laminated layer L2, the third laminated layer L3 and the fourth laminated layer L4 may include a material that is easier to reduce as they are closer to the dielectric layer 102. That is, the electronegativity of the fourth laminated layer L4 contacting the second conductive layer 103 may be the lowest, and the electronegativity of the first laminated layer L1 contacting the dielectric layer 102 may be the highest.

Figure 4:
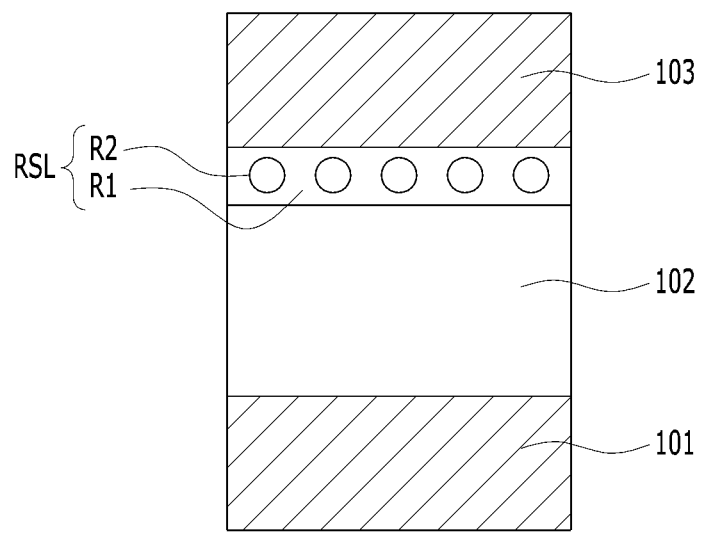

FIG. 4 is a cross-sectional view of a semiconductor device in accordance with an embodiment of the present invention.

Referring to FIG. 4, the semiconductor device 141 may include a first conductive layer 101, a dielectric layer 102, and a second conductive layer 103. The semiconductor device 141 may further include a reduction sacrificial layer RSL disposed between the dielectric layer 102 and the second conductive layer 103. The reduction sacrificial layer RSL may have a structure in which a second reduction sacrificial material R2 and a first reduction sacrificial material R1 are intermixed. The reduction sacrificial layer RSL may have a structure in which the first reduction sacrificial material R1 is doped with the second reduction sacrificial material R2.

Each of the second reduction sacrificial material R2 and the first reduction sacrificial material R1 may include a material having high electronegativity (EN). The first reduction sacrificial material R1 and the second reduction sacrificial material R2 may have different electronegativities. For example, the second reduction sacrificial material R2 may have higher electronegativity than the first reduction sacrificial material R1. Each of the first reduction sacrificial material R1 and the second reduction sacrificial material R2 may include niobium oxide ($Nb_2O_5$), germanium oxide ($GeO_2$), silicon oxide ($SiO_2$), titanium oxide ($TiO_2$), tantalum oxide ($Ta_2O_5$), aluminum oxide ($Al_2O_3$), molybdenum oxide ($MoO_2$ and $MoO_3$), ruthenium oxide ($RuO_2$) or iridium oxide ($IrO_2$). Each of the first reduction sacrificial material R1 and the second reduction sacrificial material R2 may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

The second reduction sacrificial material R2 may be doped during or after deposition of the first reduction sacrificial material R1, in order to form the reduction sacrificial layer RSL with an intermixing structure. In some embodiments, a post thermal anneal process may be performed after the first reduction sacrificial material R1 and the second reduction sacrificial material R2 are stacked. The post thermal anneal process may be performed in an NH3 atmosphere, plasma nitridation or plasma oxidation. The post thermal anneal process may include a laser anneal process. After the first and second reduction sacrificial materials R1 and R2 are stacked as shown in FIG. 2, the post thermal anneal process may be performed, and after the first and second reduction sacrificial materials R1 and R2 are stacked in the laminate structure as shown in FIG. 3, the post thermal anneal process may be performed.

The post thermal anneal process may be performed before the second conductive layer 103 is formed, thereby reducing the reduction sacrificial layer RSL in advance before the second conductive layer 103 is formed.

In the embodiments described above, the dielectric layer 102 may include any one of the $ZrO_2$, ZA, ZAZ, ZAZA, ZAZAZ, $HfO_2$, HA, HAH, HAHA and HAHAH stacks. The reduction sacrificial layer RSL may include the first reduction sacrificial material R1 and the second reduction sacrificial material R2. The first reduction sacrificial material R1 and the second reduction sacrificial material R2 may be different materials. The first reduction sacrificial material R1 and the second reduction sacrificial material R2 may include any one of titanium oxide ($TiO_2$), tantalum oxide ($Ta_2O_5$), niobium oxide ($Nb_2O_5$), aluminum oxide ($Al_2O_3$), silicon oxide ($SiO_2$), tin oxide ($SnO_2$), germanium oxide ($GeO_2$), molybdenum dioxide ($MoO_2$), molybdenum trioxide ($MoO_3$), iridium oxide ($IrO_2$) and ruthenium oxide ($RuO_2$).

Any one of the first and second reduction sacrificial materials R1 and R2 may be in direct contact with the dielectric layer 102, and the other one may be in direct contact with the second conductive layer 103.

The first reduction sacrificial material R1 may have higher electronegativity than the second reduction sacrificial material R2. The reduction sacrificial layer RSL may include the first reduction sacrificial material R1 contacting the dielectric layer 102 and the second reduction sacrificial material R2 contacting the second conductive layer 103.

In some embodiments, the first reduction sacrificial material R1 may include $TiO_2$ or $Ta_2O_5$, and the second reduction sacrificial material R2 may include any one of niobium oxide ($Nb_2O_5$), aluminum oxide ($Al_2O_3$), silicon oxide ($SiO_2$), tin oxide ($SnO_2$), germanium oxide ($GeO_2$), molybdenum dioxide ($MoO_2$), molybdenum trioxide ($MoO_3$), iridium oxide ($IrO_2$) and ruthenium oxide ($RuO_2$).

For example, the reduction sacrificial layer RSL may include any one of TA ($TiO_2/Al_2O_3$), TNb ($TiO_2/Nb_2O_5$), TS ($TiO_2/SiO_2$), TSn ($TiO_2/SnO_2$), TGe ($TiO_2/GeO_2$), TM ($TiO_2/MoO_2$ or $TiO_2/MoO_3$), TIr ($TiO_2/IrO_2$) and TR ($TiO_2/RuO_2$) stacks. In some embodiments, the stack of the dielectric layer 102 and the reduction sacrificial layer RSL may include a Z-TA, ZA-TA, ZAZ-TA, ZAZA-TA, ZAZAZ-TA, H-TA, HA-TA, HAH-TA, HAHA-TA or HAHAH-TA stack.

In some embodiments, the reduction sacrificial layer RSL may include the second reduction sacrificial material R2 contacting the dielectric layer 102 and the first reduction sacrificial material R1 contacting the second conductive layer 103.

For example, the reduction sacrificial layer RSL may include any one of AT ($Al_2O_3/TiO_2$), NbT ($Nb_2O_5/TiO_2$), ST ($SiO_2/TiO_2$), SnT ($SnO_2/TiO_2$), GeT ($GeO_2/TiO_2$), MT ($MoO_2/TiO_2$ or $MoO_3/TiO_2$), IrT ($IrO_2/TiO_2$) and RT ($RuO_2/TiO_2$) stacks. In some embodiments, the stack of the dielectric layer 102 and the reduction sacrificial layer RSL may include a Z-AT, ZA-AT, ZAZ-AT, ZAZA-AT, ZAZAZ-AT, H-AT, HA-AT, HAH-AT, HAHA-AT or HAHAH-AT stack.

The stack of the dielectric layer 102 and the reduction sacrificial layer RSL may be variously modified (refer to FIGS. 7A to 14D). The stack of the dielectric layer 102 and the reduction sacrificial layer RSL may also be referred to as a "high-k stack".

FIGS. 5A to 5D are cross-sectional views of semiconductor devices in accordance with embodiments.

Figure 5A:
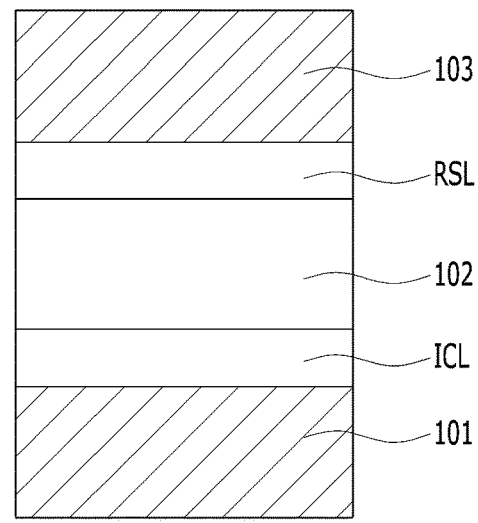

Referring to FIG. 5A, a semiconductor device 151 may include a first conductive layer 101, a dielectric layer 102, a reduction sacrificial layer RSL, and a second conductive layer 103. The semiconductor device 151 may further include an interface control layer ICL disposed between the first conductive layer 101 and the dielectric layer 102. The interface control layer ICL and the reduction sacrificial layer RSL may be the same material or different materials. The interface control layer ICL may include higher electronegativity than the dielectric layer 102. The interface control layer ICL and the reduction sacrificial layer RSL may have the same electronegativity or different electronegativities. The interface control layer ICL may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof. The interface control layer ICL may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. The interface control layer ICL may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

The interface control layer ICL and the reduction sacrificial layer RSL may have a single structure.

Figure 5B:
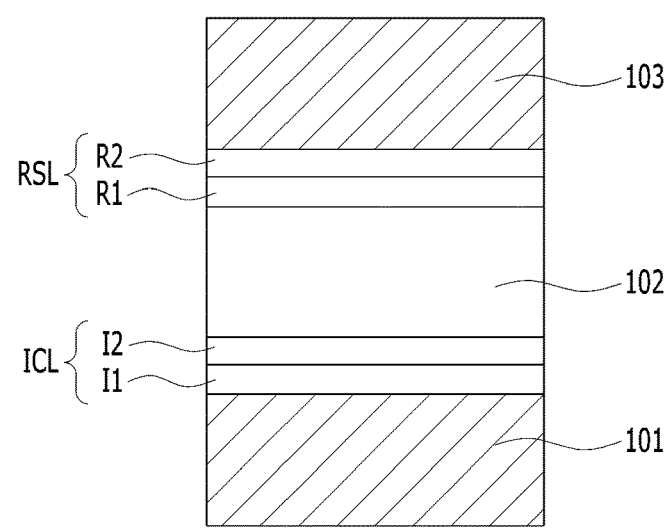

Referring to FIG. 5B, a semiconductor device 152 may include a first conductive layer 101, a dielectric layer 102, a reduction sacrificial layer RSL, and a second conductive layer 103. The semiconductor device 152 may further include an interface control layer ICL disposed between the first conductive layer 101 and the dielectric layer 102. The interface control layer ICL and the reduction sacrificial layer RSL may be the same material or different materials. The interface control layer ICL may include a material having higher electronegativity than the dielectric layer 102. The interface control layer ICL and the reduction sacrificial layer RSL may have higher electronegativity than the dielectric layer 102. The interface control layer ICL may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof. The interface control layer ICL may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof.

The interface control layer ICL and the reduction sacrificial layer RSL may have a stack structure.

The interface control layer ICL may include a stack of first and second interface control materials I1 and I2. The reduction sacrificial layer RSL may include a stack of a first reduction sacrificial material R1 and a second reduction sacrificial material R2. The first interface control material I1 and the first reduction sacrificial material R1 may be the same material, and the second interface control material I2 and the second reduction sacrificial material R2 may be the same material. The first interface control material I1 and the second reduction sacrificial material R2 may be the same material, and the second interface control material I2 and the first reduction sacrificial material R1 may be the same material. The first interface control material I1 may be in direct contact with the first conductive layer 101, and the second reduction sacrificial material R2 may be in direct contact with the second conductive layer 103. The first interface control material I1 and the second reduction sacrificial material R2 may have higher electronegativity than the second interface control material I2 and the first reduction sacrificial material R1, respectively.

Each of the first interface control material I1, the second interface control material I2, the first reduction sacrificial material R1 and the second reduction sacrificial material R2 may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. Each of the first interface control material I1, the second interface control material I2, the first reduction sacrificial material R1 and the second reduction sacrificial material R2 may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

Figure 5C:
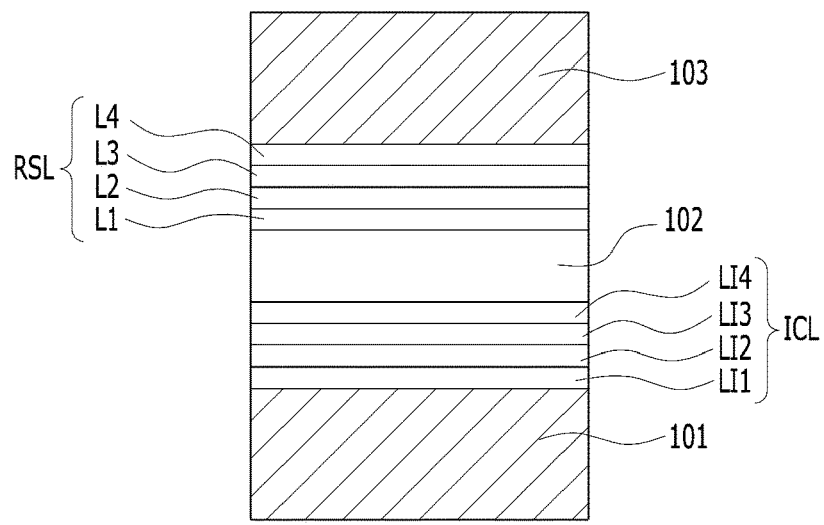

Referring to FIG. 5C, a semiconductor device 153 may include a first conductive layer 101, a dielectric layer 102, a reduction sacrificial layer RSL, and a second conductive layer 103. The semiconductor device 153 may further include an interface control layer ICL disposed between the first conductive layer 101 and the dielectric layer 102. The interface control layer ICL and the reduction sacrificial layer RSL may be the same material or different materials. The interface control layer ICL may include a material having higher electronegativity than the dielectric layer 102. The interface control layer ICL and the reduction sacrificial layer RSL may have higher electronegativity than the dielectric layer 102. The interface control layer ICL may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof. The interface control layer ICL may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. The interface control layer ICL may include a plurality of laminated layers. For example, the interface control layer ICL may have a structure in which a first laminated interface layer LI1, a second laminated interface layer LI2, a third laminated interface layer LI3 and a fourth laminated interface layer LI4 are sequentially stacked. The first to fourth laminated interface layers LI1 to LI4 may be the same as the first to fourth laminated layers L1 to L4 shown in FIG. 3.

Figure 5D:
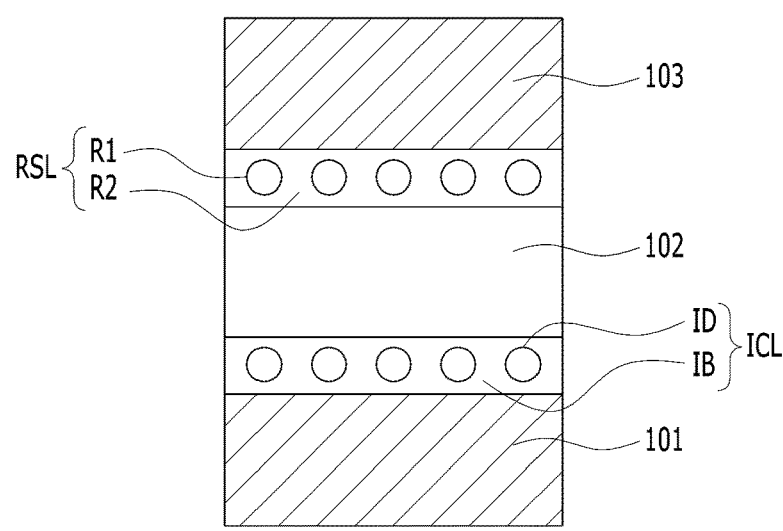

Referring to FIG. 5D, a semiconductor device 154 may include a first conductive layer 101, a dielectric layer 102, a reduction sacrificial layer RSL, and a second conductive layer 103. The semiconductor device 154 may further include an interface control layer ICL disposed between the first conductive layer 101 and the dielectric layer 102. The interface control layer ICL and the reduction sacrificial layer RSL may be the same material or different materials. The interface control layer ICL may include a material having higher electronegativity than the dielectric layer 102. The interface control layer ICL and the reduction sacrificial layer RSL may have higher electronegativity than the dielectric layer 102. The interface control layer ICL may include titanium (Ti), tantalum (Ta), aluminum (Al), tin (Sn), molybdenum (Mo), ruthenium (Ru), iridium (Ir), niobium (Nb), germanium (Ge), silicon (Si) or combinations thereof. The interface control layer ICL may include titanium oxide ($TiO_2$), tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$), silicon oxide ($SiO_2$) or combinations thereof. The interface control layer ICL may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof. The interface control layer ICL may include a material in which a first interface control material IB and a second interface control material ID are intermixed with each other.

The first interface control material IB and the second interface control material ID may include a material having higher electronegativity EN than the dielectric layer 102. The second interface control material ID may be a material that is easier to reduce than the first interface control material IB.

In FIGS. 5A to 5D described above, each of the reduction sacrificial layer RSL and the interface control layer ICL may have any one of a single structure, a stack structure, a laminate structure and an intermixing structure.

In some embodiments, the reduction sacrificial layer RSL and the interface control layer ICL may be formed of the same material and have the same structure.

In some embodiments, the reduction sacrificial layer RSL and the interface control layer ICL may be formed of different materials and have different structures. For example, the reduction sacrificial layer RSL may have a single structure, and the interface control layer ICL may have any one of a single structure, a stack structure, a laminate structure and an intermixing structure. For example, the interface control layer ICL may be a single layer, and the reduction control layer RSL may have any one of the single structure, the stack structure, the laminate structure and the intermixing structure.

In some embodiments, the reduction sacrificial layer RSL may also be referred to as an "upper interface control layer (Upper ICL)", and the interface control layer ICL may also be referred to as a "lower interface control layer (Lower ICL)". Accordingly, the reduction sacrificial layer RSL may contribute to the interface engineering between the dielectric layer 102 and the second conductive layer 103, and the interface control layer ICL may contribute to the interface engineering between the first conductive layer 101 and the dielectric layer 102.

The stack of the dielectric layer 102, the reduction sacrificial layer RSL and the interfacial control layer ICL may also be referred to as a "high-k stack".

In the embodiments described above, the second conductive layer 103 may be formed in a reducing atmosphere. The reducing atmosphere may include a reducing material such as hydrogen, a hydrogen compound or a nitrogen-hydrogen compound. For example, the second conductive layer 103 may be formed of titanium nitride (TiN), and the titanium nitride (TiN) may be formed of $TiCl_4$ and $NH_3$. Herein, $NH_3$ may be the reducing material. In some embodiments, the titanium nitride (TiN) may be formed of a metal organic source and $NH_3$. The metal organic source may include TEMAT (tetrakis(ethylmethylamino)titanium), TDMAT (tetrakis(dimethylamino)titanium) or TDEAT (tetrakis(diethylamino)titanium).

The reduction sacrificial layer RSL may be reduced earlier than the dielectric layer 102 when the second conductive layer 103 is formed, thereby preventing the dielectric layer 102 from being reduced. When the dielectric layer 102 such as zirconium oxide and hafnium oxide are directly exposed to a reducing atmosphere, reduction may occur easily. Since the reduction sacrificial layer RSL has higher electronegativity than the dielectric layer 102, the reduction sacrificial layer RSL may be easier to reduce than the dielectric layer 102. Accordingly, the reduction sacrificial layer RSL may suppress a defect such as oxygen loss of the dielectric layer 102.

Since a defect of the dielectric layer 102 is suppressed by the reduction sacrificial layer RSL, the $T_{ox}$ of the dielectric layer 102 may decrease, and the capacitance may increase. It is also possible to reduce leakage current caused by a defect.

When the reduction sacrificial layer RSL is formed between the second conductive layer 103 and the dielectric layer 102, the valence band offset (VBO) may decrease. As the valance band offset (VBO) decreases, the conduction band offset (CBO) may increase. The increase of the conduction bad offset may raise the barrier over which electrons pass, thereby reducing leakage current.

Figure 6A:
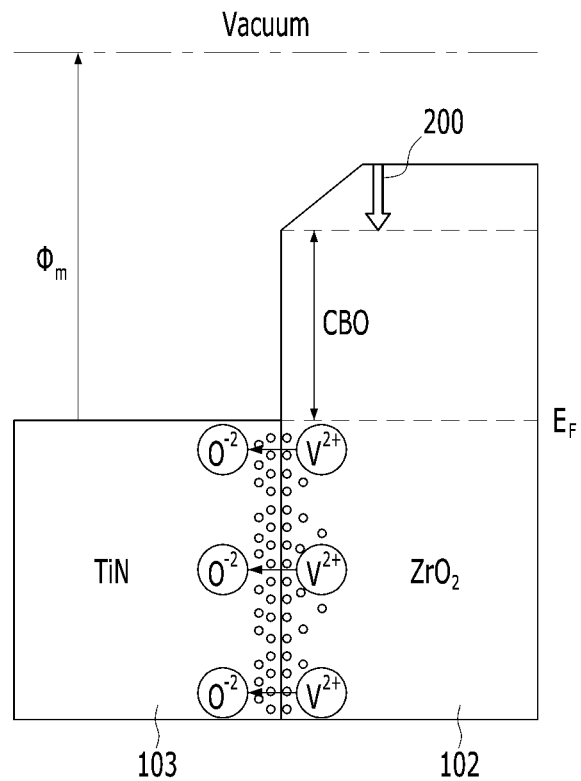
FIG. 6A is a diagram describing a band offset of a semiconductor device interface in accordance with a comparative example.
Figure 6B:
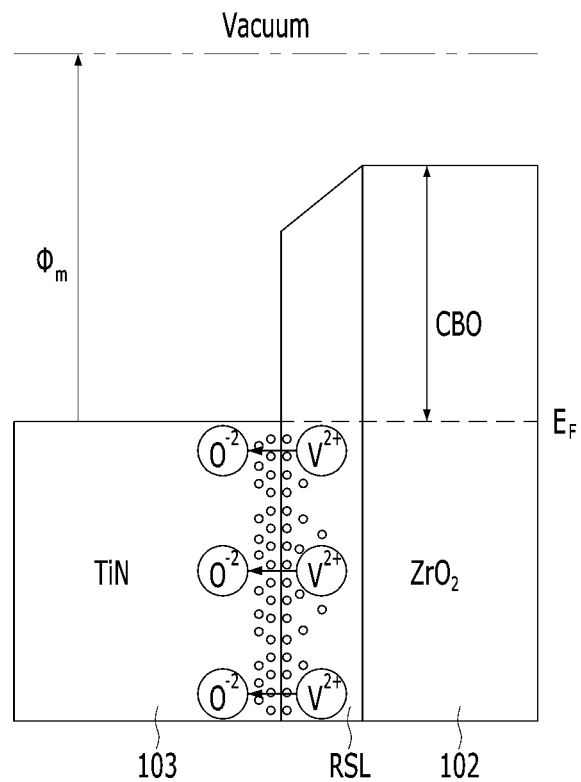
FIG. 6B is a diagram describing a band offset of an interface in the semiconductor devices in accordance with embodiments of the present invention.

FIG. 6A is a diagram describing a band offset of an interface in a semiconductor device in accordance with a comparative example. FIG. 6B is a diagram describing a band offset of an interface in semiconductor devices in accordance with an embodiment of the present invention. In FIGS. 6A and 6B, as an example, the second conductive layer 103 may be titanium nitride (TiN), the dielectric layer 102 may be zirconium oxide ($ZrO_2$), and the reduction sacrificial layer RSL may be germanium oxide ($GeO_2$). The comparative example of FIG. 6A may have a structure without the reduction sacrificial layer RSL.

Referring to FIG. 6A, reduction in which oxygen ($O^{-2}$) of the dielectric layer 102 is taken by the second conductive layer 103 may easily occur at the interface between the second conductive layer 103 and the dielectric layer 102. Oxygen vacancies ($V^{2+}$) occur in the dielectric layer 102 due to the reduction. In other words, the reduction of the dielectric layer 102 may lower the conduction band offset (CBO) between the second conductive layer 103 and the dielectric layer 102 (refer to reference numeral 200). As the conduction band offset CBO is lowered, the potential barrier between the second conductive layer 103 and the dielectric layer 102 may be lowered. When the potential barrier is lowered, the electrons stored in the dielectric layer 102 may easily move to the second conductive layer 103, thereby increasing leakage current.

Referring to FIG. 6B, when the reduction sacrificial layer RSL is present between the second conductive layer 103 and the dielectric layer 102, the conduction band offset (CBO) between the second conductive layer 103 and the dielectric layer 102 may be prevented from being lowered. In other words, since the reduction sacrificial layer RSL is reduced earlier than the dielectric layer 102, the conduction band offset (CBO) may be higher than in the comparative example. Since the conduction band offset CBO is high, the potential barrier between the second conductive layer 103 and the dielectric layer 102 may increase. When the potential barrier increases, the electrons of the dielectric layer 102 may be prevented from moving to the second conductive layer 103. In this manner, by inserting the reduction sacrificial layer RSL disposed between the dielectric layer 102 and the second conductive layer 103, it is possible to prevent a leakage current phenomenon that the dielectric layer 102 loses electrons.

As the electronegativity of the reduction sacrificial material included in the reduction sacrificial layer RSL becomes higher, a conduction band offset lowering phenomenon (CBO Lowering) may be further prevented.

FIGS. 7A to 14D are diagrams illustrating application examples of the semiconductor device in accordance with the present embodiment. FIGS. 7A, 8A, 9A, 10A, 11A, 12A, 13A and 14A are application examples of the reduction sacrificial layer with a single structure. FIGS. 7B, 8B, 9B, 10B, 11B, 12B, 13B and 14B are application examples of the reduction sacrificial layer with a stack structure. FIGS. 7C, 8C, 9C, 10C, 11C, 12C, 13C and 14C are application examples of the reduction sacrificial layer with a laminate structure. FIGS. 7D, 8D, 9D, 10D, 11D, 12D, 13D and 14D are application examples of the reduction sacrificial layer with an intermixing structure. The thickness of the reduction sacrificial layer RSL in FIGS. 7A to 14D is enlarged for convenience in description, and the thickness of the reduction sacrificial layer RSL may be ultra-thin and thinner than that of the dielectric layer 102.

In FIGS. 7A to 14D, as an example, the dielectric layer 102 may include zirconium oxide ($ZrO_2$). However, the dielectric layer 102 is not limited to the zirconium oxide, and may include, for example, ZA, ZAZ, ZAZA, hafnium oxide ($HfO_2$), HA, HAH or HAHA.

The reduction sacrificial layer RSL may have higher electronegativity than zirconium oxide ($ZrO_2$) used for the dielectric layer 102. Accordingly, the reduction sacrificial layer RSL is likely to be reduced earlier than the zirconium oxide ($ZrO_2$) when the second conductive layer 103 is formed.

In FIGS. 7A to 14D, as an example, the second conductive layer 103 may include titanium nitride (TiN). However, the second conductive layer 103 is not limited to the titanium nitride (TiN), and may be formed, for example, by stacking silicon germanium (SiGe) on the titanium nitride (TiN). In some embodiments, the second conductive layer 103 may be formed by stacking titanium nitride (TiN) on silicon germanium (SiGe). In some embodiments, the second conductive layer 103 may include a metal nitride such as tungsten nitride (WN).

In FIGS. 7A to 14D, as an example, the first conductive layer 101 may include titanium nitride (TiN). However, the first conductive layer 101 is not limited to the titanium nitride (TiN), and may include, for example, a metal nitride such as tungsten nitride (WN).

In FIGS. 7A to 7D, for example, the reduction sacrificial layer RSL may include aluminum oxide ($Al_2O_3$). However, the reduction sacrificial layer RSL including the aluminum oxide may also be referred to as an "aluminum oxide-based reduction sacrificial layer".

Figure 7A:
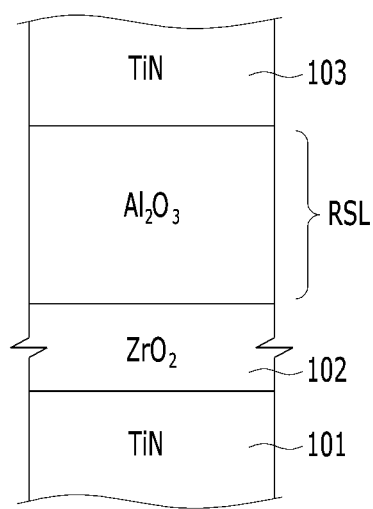
FIGS. 7A to 14D are diagrams illustrating application examples of the semiconductor device.
Figure 7B:
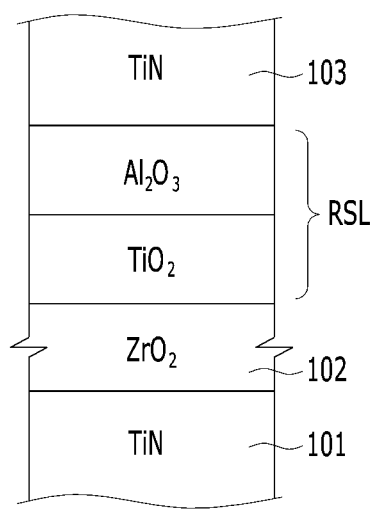
Figure 7C:
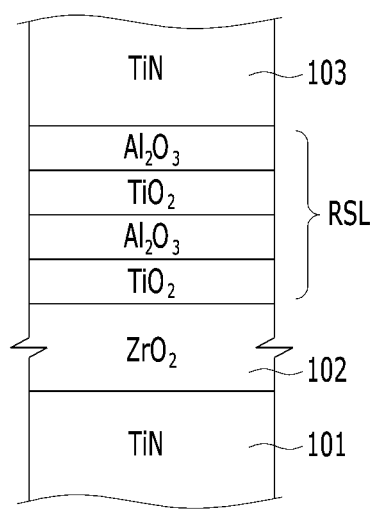
Figure 7D:
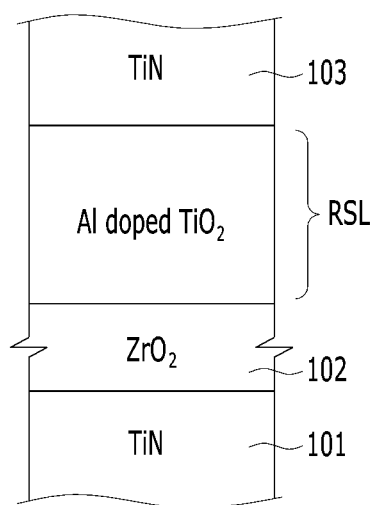

In FIG. 7A, for example, the reduction sacrificial layer RSL in the single structure may be aluminum oxide ($Al_2O_3$). In FIG. 7B, for example, the reduction sacrificial layer RSL may have a TA ($TiO_2/Al_2O_3$) structure. In FIG. 7C, for example, the reduction sacrificial layer RSL may have a TATA ($TiO_2/Al_2O_3/TiO_2/Al_2O_3$) structure. In FIG. 7D, for example, the reduction sacrificial layer RSL may have an aluminum-doped titanium oxide (Al-doped $TiO_2$) structure.

In some embodiments, the reduction sacrificial layer RSL may include an AT ($Al_2O_3/TiO_2$), ATAT ($Al_2O_3/TiO_2/Al_2O_3/TiO_2$) or ATA ($Al_2O_3/TiO_2/Al_2O_3$) structure.

In some embodiments, the aluminum oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$) or silicon oxide ($SiO_2$).

In FIGS. 8A to 8D, for example, the reduction sacrificial layer RSL may include tin oxide. The reduction sacrificial layer RSL including the tin oxide may also be referred to as a "tin oxide-based reduction sacrificial layer".

Figure 8A:
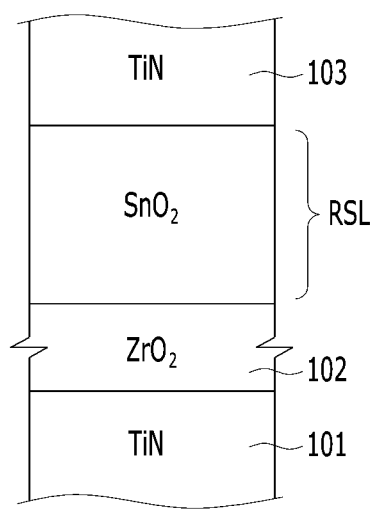
Figure 8B:
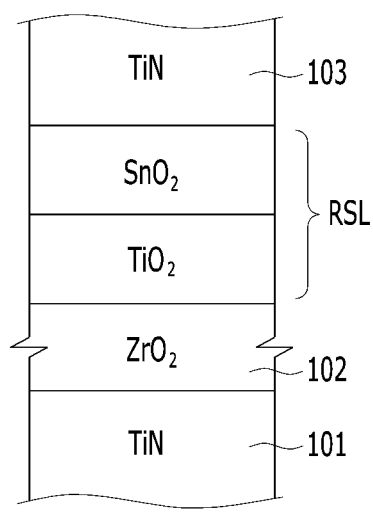
Figure 8C:
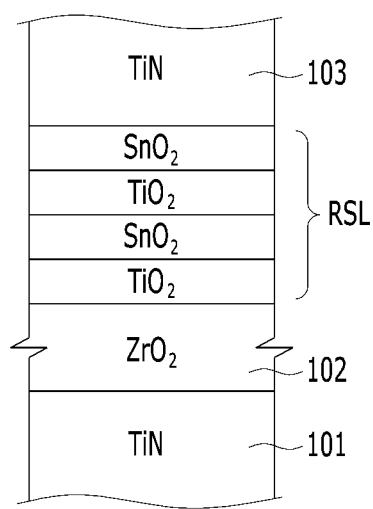
Figure 8D:
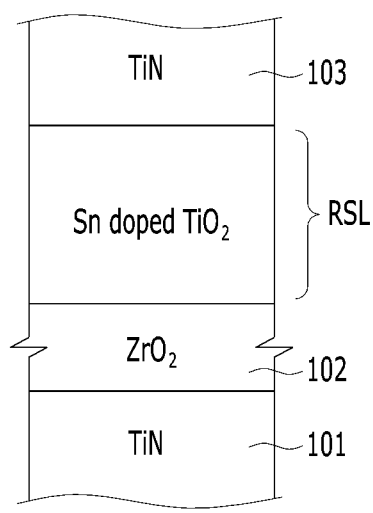

In FIG. 8A, for example, the reduction sacrificial layer RSL with a single structure may be tin oxide ($SnO_2$). In FIG. 8B, for example, the reduction sacrificial layer RSL may have a TSn ($TiO_2/SnO_2$) structure. In FIG. 8C, for example, the reduction sacrificial layer RSL may have a TSnTSn ($TiO_2/SnO_2/TiO_2/SnO_2$) structure. In FIG. 8D, for example, the reduction sacrificial layer RSL may have a tin-doped titanium oxide (Sn-doped $TiO_2$) structure.

In some embodiments, the reduction sacrificial layer RSL may include a SnT ($SnO_2/TiO_2$), SnTSnT ($SnO_2/TiO_2/SnO_2/TiO_2$) or SnTSn ($SnO_2/TiO_2/SnO_2$) structure.

In some embodiments, the tin oxide-based reduction sacrificial layer RSL may be stacked on, laminated on or intermixed with a reduction sacrificial material other than titanium oxide ($TiO_2$). The other reduction sacrificial material may include, for example, tantalum oxide ($Ta_2O_5$), aluminum oxide ($Al_2O_3$), molybdenum dioxide ($MoO_2$), molybdenum trioxide ($MoO_3$), ruthenium oxide ($RuO_2$), iridium oxide ($IrO_2$), niobium oxide ($Nb_2O_5$), germanium oxide ($GeO_2$) or silicon oxide ($SiO_2$).

In FIGS. 9A to 9D, for example, the reduction sacrificial layer RSL may include molybdenum oxide. The reduction sacrificial layer RSL including the molybdenum oxide may also be referred to as a "molybdenum oxide-based reduction sacrificial layer".

Figure 9A:
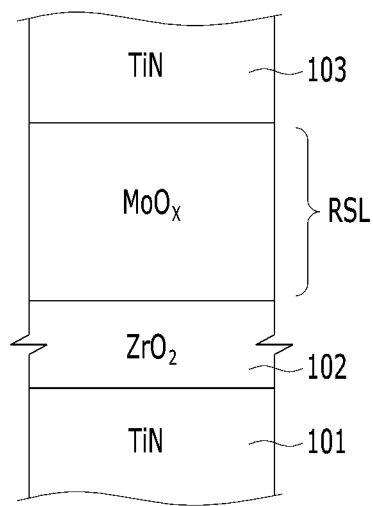
Figure 9B:
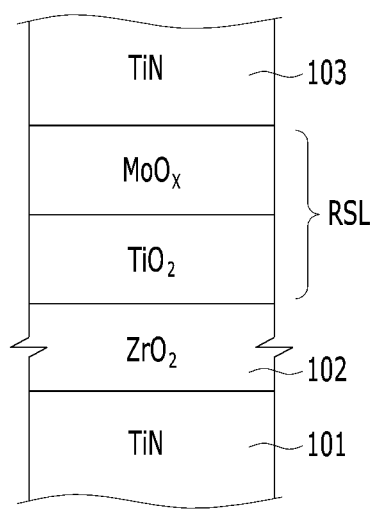
Figure 9C:
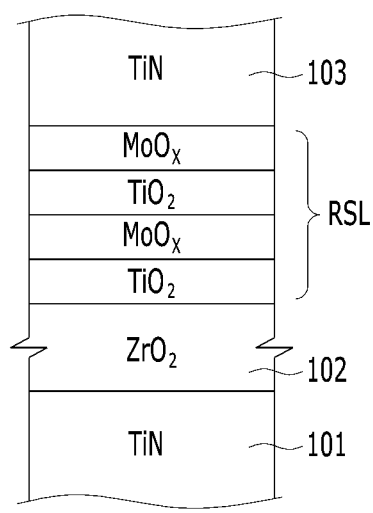
Figure 9D:
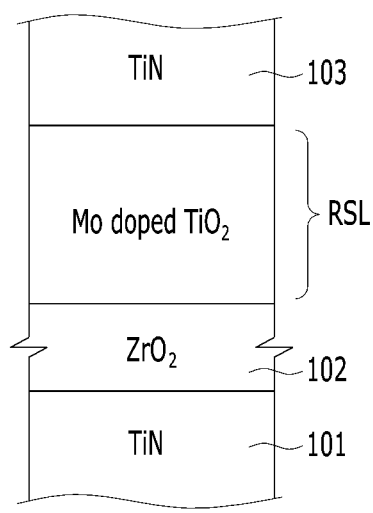

In FIG. 9A, for example, the reduction sacrificial layer RSL with a single structure may be molybdenum oxide ($MoO_x$). The molybdenum oxide ($MoO_x$) may include molybdenum dioxide ($MoO_2$) or molybdenum trioxide ($MoO_3$). In FIG. 9B, for example, the reduction sacrificial layer RSL may have a TMo ($TiO_2/MoO_x$) structure. In FIG. 9C, for example, the reduction sacrificial layer RSL may have a TMoTMo ($TiO_2/MoO_x/TiO_2/MoO_x$) structure. In FIG. 9D, for example, the reduction sacrificial layer RSL may have a molybdenum-doped titanium oxide (Mo-doped $TiO_2$) structure.

In some embodiments, the reduction sacrificial layer RSL may include a MoT ($MoO_x/TiO_2$), MoTMoT ($MoO_x/TiO_2/MoO_x/TiO_2$) or MoTMo ($MoO_x/TiO_2/MoO_x$) structure.

In some embodiments, the molybdenum oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), ruthenium oxide ($RuO_2$), iridium oxide ($IrO_2$), niobium oxide ($Nb_2O_5$), germanium oxide ($GeO_2$) or silicon oxide ($SiO_2$).

In FIGS. 10A to 10D, for example, the reduction sacrificial layer RSL may include ruthenium oxide ($RuO_2$). The reduction sacrificial layer RSL including the ruthenium oxide may also be referred to as a "ruthenium oxide-based reduction sacrificial layer".

Figure 10A:
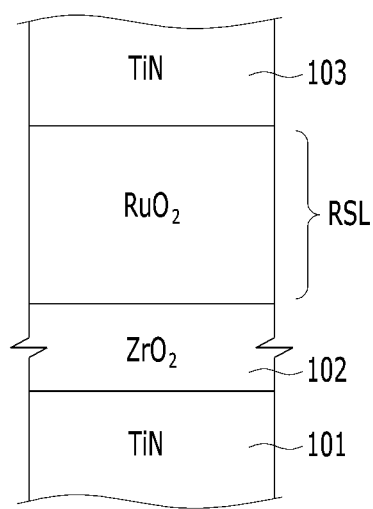
Figure 10B:
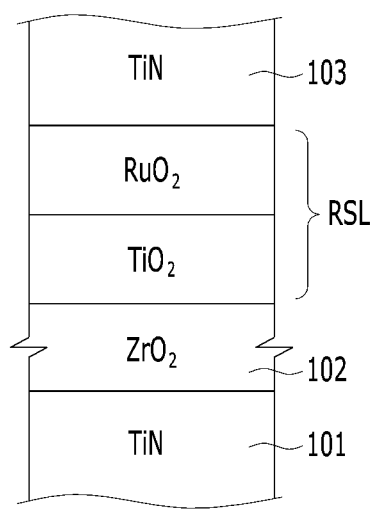
Figure 10C:
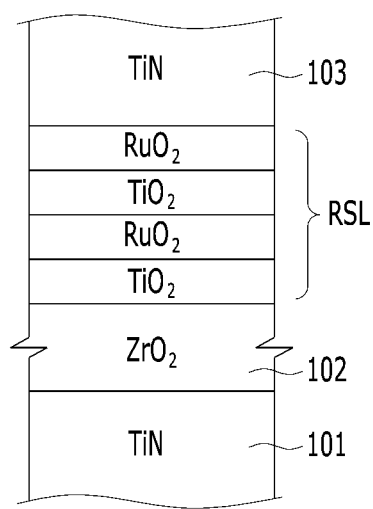
Figure 10D:
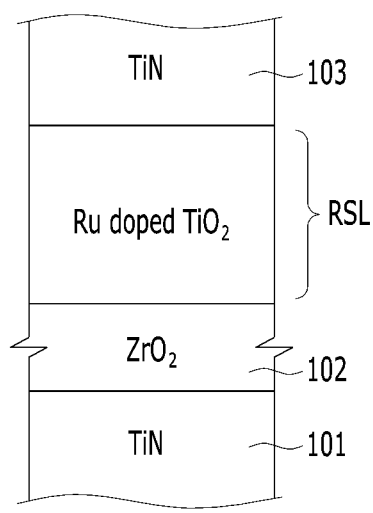

In FIG. 10A, for example, the reduction sacrificial layer RSL with a single structure may be ruthenium oxide ($RuO_2$). In FIG. 10B, for example, the reduction sacrificial layer RSL may have a TR ($TiO_2/RuO_2$) structure. In FIG. 10C, for example, the reduction sacrificial layer RSL may have a TRTR ($TiO_2/RuO_2/TiO_2/RuO_2$) structure. In FIG. 10D, for example, the reduction sacrificial layer RSL may have a ruthenium-doped titanium oxide (Ru-doped $TiO_2$) structure.

In some embodiments, the reduction sacrificial layer RSL may include a RT ($RuO_2/TiO_2$), RTRT ($RuO_2/TiO_2/RuO_2/TiO_2$) or RTR ($RuO_2/TiO_2/RuO_2$) structure.

In some embodiments, the ruthenium oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), molybdenum dioxide ($MoO_2$), molybdenum trioxide ($MoO_3$), iridium oxide ($IrO_2$), niobium oxide ($Nb_2O_5$), germanium oxide ($GeO_2$) or silicon oxide ($SiO_2$).

In FIGS. 11A to 11D, for example, the reduction sacrificial layer RSL may include iridium oxide ($IrO_2$). The reduction sacrificial layer RSL including the iridium oxide may also be referred to as an "iridium oxide-based reduction sacrificial layer".

Figure 11A:
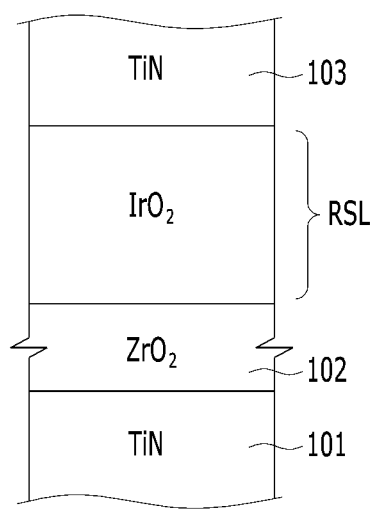
Figure 11B:
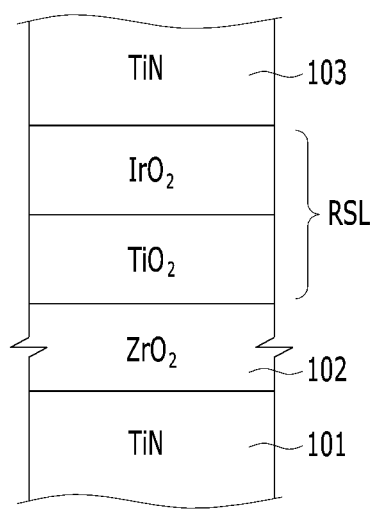
Figure 11C:
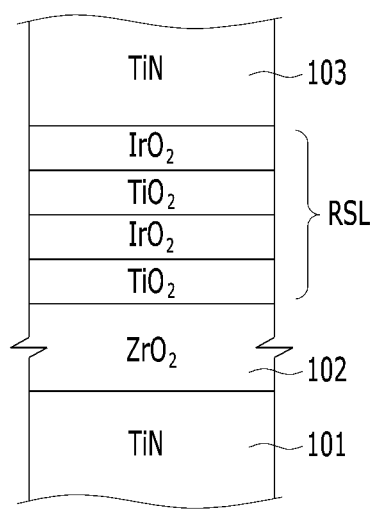
Figure 11D:
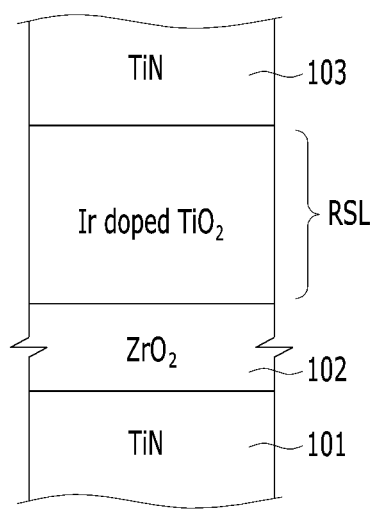

In FIG. 11A, for example, the reduction sacrificial layer RSL with a single structure may be iridium oxide ($IrO_2$). In FIG. 11B, for example, the reduction sacrificial layer RSL may have a TIr ($TiO_2/IrO_2$) structure. In FIG. 11C, for example, the reduction sacrificial layer RSL may have a TIrTIr ($TiO_2/IrO_2/TiO_2/IrO_2$) structure. In FIG. 11D, for example, the reduction sacrificial layer RSL may have an iridium-doped titanium oxide (Ir-doped $TiO_2$) structure.

In some embodiments, the reduction sacrificial layer RSL may include an IrT ($IrO_2/TiO_2$), IrTIrT ($IrO_2/TiO_2/IrO_2/TiO_2$) or IrTIr($IrO_2/TiO_2/IrO_2$) structure.

In some embodiments, the iridium oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), niobium oxide ($Nb_2O_5$), germanium oxide ($GeO_2$) or silicon oxide ($SiO_2$).

In FIGS. 12A to 12D, for example, the reduction sacrificial layer RSL may include niobium oxide ($Nb_2O_5$). The reduction sacrificial layer RSL including the niobium oxide may also be referred to as a "niobium oxide-based reduction sacrificial layer".

Figure 12A:
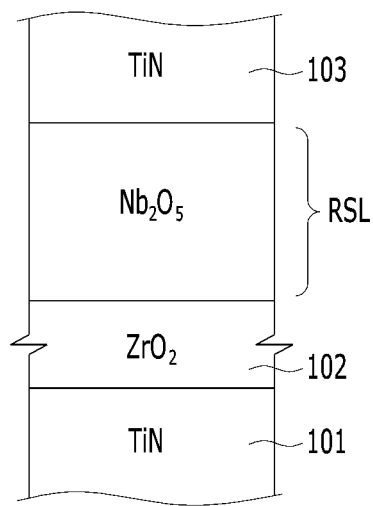
Figure 12B:
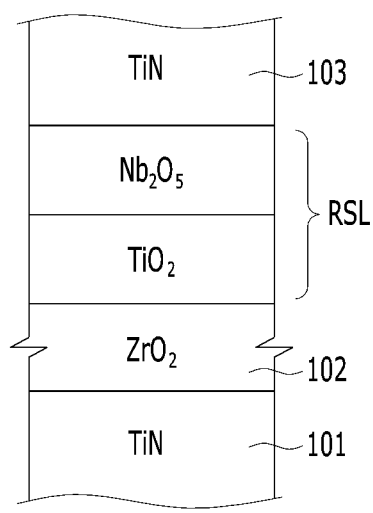
Figure 12C:
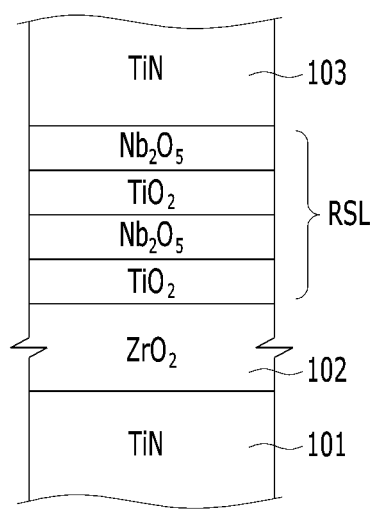
Figure 12D:
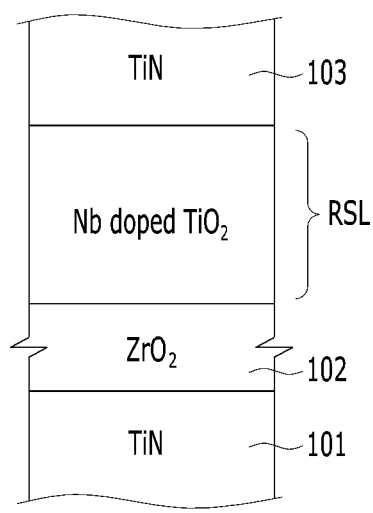

In FIG. 12A, for example, the reduction sacrificial layer RSL with a single structure may be niobium oxide ($Nb_2O_5$). In FIG. 12B, for example, the reduction sacrificial layer RSL may have a TNb ($TiO_2/Nb_2O_5$) structure. In FIG. 12C, for example, the reduction sacrificial layer RSL may have a TNbTNb ($TiO_2/Nb_2O_5/TiO_2/Nb_2O_5$) structure. In FIG. 12D, for example, the reduction sacrificial layer RSL may have a niobium-doped titanium oxide (Nb-doped $TiO_2$) structure.

In some embodiments, the reduction sacrificial layer RSL may include an NbT ($Nb_2O_5/TiO_2$), NbTNbT ($Nb_2O_5/TiO_2/Nb_2O_5/TiO_2$) or NbTNb ($Nb_2O_5/TiO_2/Nb_2O_5$) structure.

In some embodiments, the niobium oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), germanium oxide ($GeO_2$) or silicon oxide ($SiO_2$).

In FIGS. 13A to 13D, for example, the reduction sacrificial layer RSL may include germanium oxide ($GeO_2$). The reduction sacrificial layer RSL including the germanium oxide may also be referred to as a "germanium oxide-based reduction sacrificial layer".

Figure 13A:
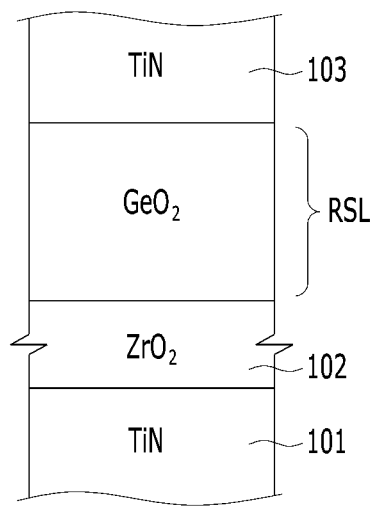
Figure 13B:
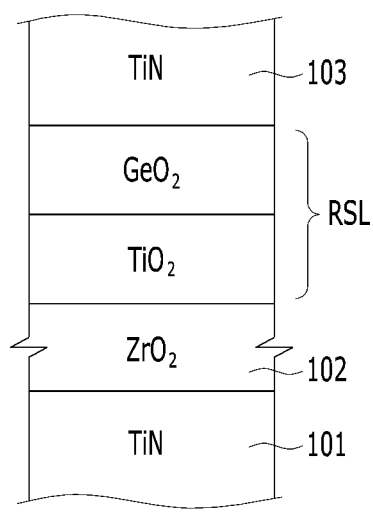
Figure 13C:
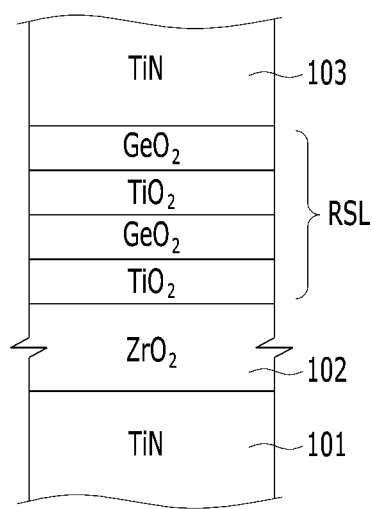
Figure 13D:
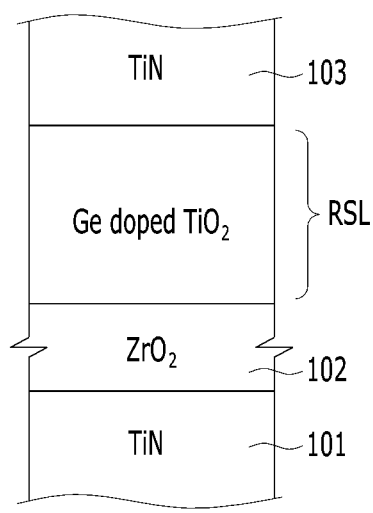

In FIG. 13A, for example, the reduction sacrificial layer RSL with a single structure may be germanium oxide ($GeO_2$). In FIG. 13B, for example, the reduction sacrificial layer RSL may have a TGe ($TiO_2/GeO_2$) structure. In FIG. 13C, for example, the reduction sacrificial layer RSL may have a TGeTGe ($TiO_2/GeO_2/TiO_2/GeO_2$) structure. In FIG. 13D, for example, the reduction sacrificial layer RSL may have a germanium-doped titanium oxide (Ge-doped $TiO_2$) structure.

In some embodiments, the reduction sacrificial layer RSL may include a GeT ($GeO_2/TiO_2$), GeTGeT ($GeO_2/TiO_2/GeO_2/TiO_2$) or GeTGe ($GeO_2/TiO_2/GeO_2$) structure.

In some embodiments, the germanium oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$) or silicon oxide ($SiO_2$).

In FIGS. 14A to 14D, for example, the reduction sacrificial layer RSL may include silicon oxide ($SiO_2$). The reduction sacrificial layer RSL including the silicon oxide may also be referred to as a "silicon oxide-based reduction sacrificial layer".

Figure 14A:
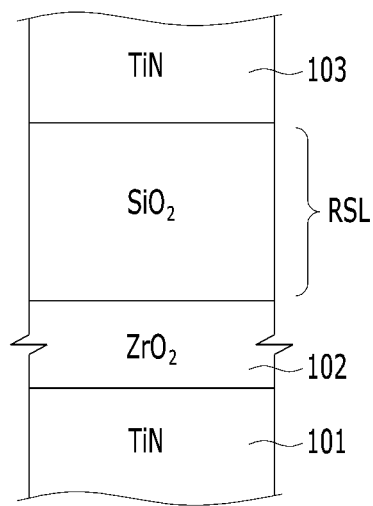
Figure 14B:
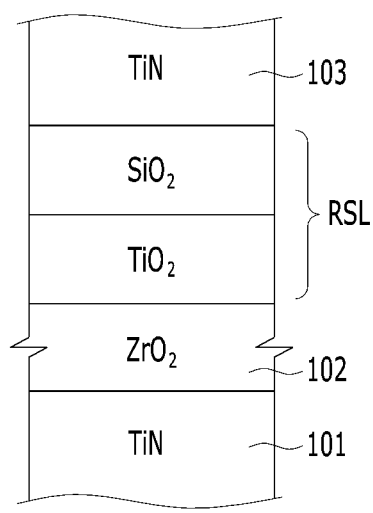
Figure 14C:
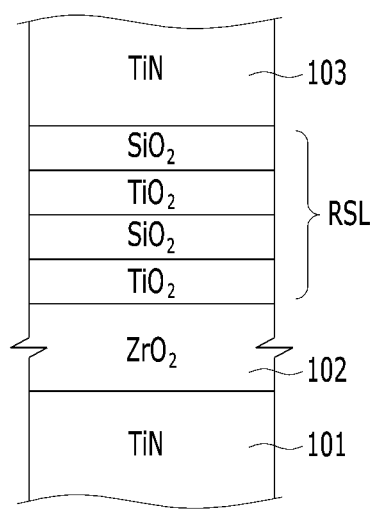
Figure 14D:
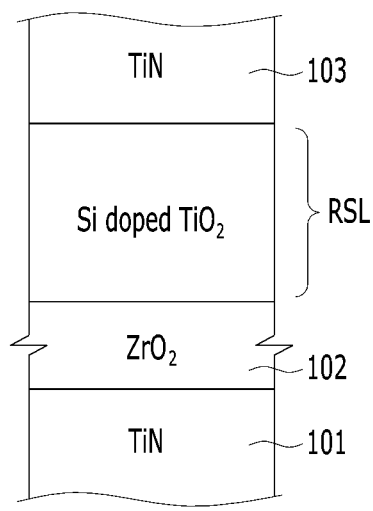

In FIG. 14A, for example, the reduction sacrificial layer RSL with a single structure may be silicon oxide ($SiO_2$). In FIG. 14B, for example, the reduction sacrificial layer RSL may have a TS ($TiO_2/SiO_2$) structure. In FIG. 14C, for example, the reduction sacrificial layer RSL may have a TSTS ($TiO_2/SiO_2/TiO_2/SiO_2$) structure. In FIG. 14D, for example, the reduction sacrificial layer RSL may have a silicon-doped titanium oxide (Si-doped $TiO_2$) structure.

In some embodiments, the reduction sacrificial layer RSL may include a ST ($SiO_2/TiO_2$), STST ($SiO_2/TiO_2/SiO_2/TiO_2$) or STS ($SiO_2/TiO_2/SiO_2$) structure.

In some embodiments, the silicon oxide-based reduction sacrificial layer RSL may be stacked on, laminated on or intermixed with a reduction sacrificial material other than titanium oxide ($TiO_2$). The other reduction sacrificial material may include tantalum oxide ($Ta_2O_5$), aluminum oxide ($Al_2O_3$), tin oxide ($SnO_2$), molybdenum dioxide ($MoO_2$), molybdenum trioxide ($MoO_3$), ruthenium oxide ($RuO_2$), iridium oxide ($IrO_2$), niobium oxide ($Nb_2O_5$) or germanium oxide ($GeO_2$).

In FIGS. 7A to 14D, the reduction sacrificial layer RSL may include a metal suboxide, a stack of different metal suboxides, a laminate structure of different metal suboxides or an intermixing structure of different metal suboxides.

In FIGS. 7A to 14D, the first conductive layer 101, the dielectric layer 102, the reduction sacrificial layer RSL and the second conductive layer 103 may be deposited by atomic layer deposition (ALD). In FIGS. 7A to 14D, the first conductive layer 101, the dielectric layer 102, the reduction sacrificial layer RSL and the second conductive layer 103 may be deposited by metal organic atomic layer deposition (MOALD).

In FIGS. 7A, 8A, 9A, 10A, 11A, 12A, 13A and 14A, the reduction sacrificial layer RSL with a single structure may have a structure similar to those of FIGS. 1B and 1C.

In FIGS. 7A to 14D, the interface control layer ICL may be further included between the first conductive layer 101 and the dielectric layer 102. The interface control layer ICL may correspond to the interface control layers shown in FIGS. 5A to 5D.

In FIGS. 7A to 14D, the reduction sacrificial layer RSL may include one suboxide of materials selected from titanium (Ti), tantalum (Ta), aluminum (Al), tin (Sn), molybdenum (Mo), ruthenium (Ru), iridium (Ir), niobium (Nb), germanium (Ge), silicon (Si) and combinations thereof.

Figure 15A:
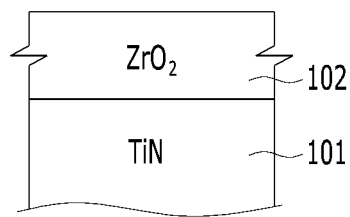
FIGS. 15A to 15C are diagrams illustrating an example of a method for forming a semiconductor device.
Figure 15B:
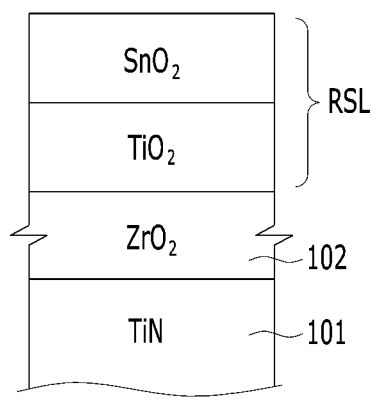
Figure 15C:
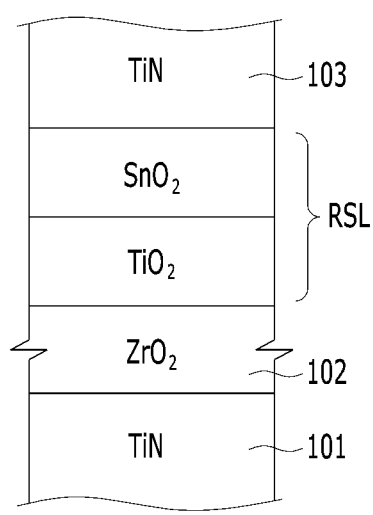

FIGS. 15A to 15C are diagrams illustrating an example of a method for forming a semiconductor device. FIGS. 15A to 15C show an example of a method for forming a reduction sacrificial layer with a stack structure.

As shown in FIG. 15A, a first conductive layer 101 may be formed. A dielectric layer 102 may be formed on the first conductive layer 101. The first conductive layer 101 may include titanium nitride (TiN). The first conductive layer 101 is not limited to the titanium nitride. The first conductive layer 101 may be formed by ALD. The first conductive layer 101 may include 'ALD TiN'. ALD TiN may be deposited using a titanium source material and a nitrogen source material. The titanium source material may include $TiCl_4$, and the nitrogen source material may include $NH_3$.

The dielectric layer 102 may include a zirconium oxide-based layer. The dielectric layer 102 may include zirconium oxide ($ZrO_2$). The dielectric layer 102 may be formed by ALD.

As shown in FIG. 15B, a reduction sacrificial layer RSL may be formed on the dielectric layer 102. The reduction sacrificial layer RSL may be formed by sequentially stacking titanium oxide ($TiO_2$) and tin oxide ($SnO_2$). The tin oxide ($SnO_2$) may have higher electronegativity than the titanium oxide ($TiO_2$). The reduction sacrificial layer RSL may have a small thickness. The reduction sacrificial layer RSL may have a thickness of approximately 0.1 to 2 nm. The reduction sacrificial layer RSL may be formed by ALD.

As shown in FIG. 15C, a second conductive layer 103 may be formed on the reduction sacrificial layer RSL. The second conductive layer 103 may include a metal, a metal nitride, a conductive metal oxide or combinations thereof. The second conductive layer 103 may include titanium (Ti), titanium nitride (TiN), tantalum nitride (TaN), tungsten (W), tungsten nitride (WN), ruthenium, iridium, ruthenium oxide, iridium oxide or combinations thereof. In the embodiment, the second conductive layer 103 may include titanium nitride. The second conductive layer 103 may be formed by ALD. Accordingly, the second conductive layer 103 may include 'ALD TiN'. ALD TiN may be deposited using a titanium source material and a nitrogen source material. The titanium source material may include $TiCl_4$, and the nitrogen source material may include $NH_3$.

The reduction sacrificial layer RSL may be reduced earlier than the dielectric layer 102 by $NH_3$ which is a nitrogen source material, when the second conductive layer 103 is formed. Accordingly, reduction of the dielectric layer 102 may be prevented, and an oxygen loss of the dielectric layer 102 may be suppressed. The reduction sacrificial layer RSL may be modified to an oxygen-deficient reduction sacrificial layer RSL' after the reduction. The oxygen-deficient reduction sacrificial layer RSL' may be tin suboxide ($SnO_{2-x}$) or SnO. The tin suboxide ($SnO_{2-x}$) has conductivity because it is more oxygen-deficient than tin oxide ($SnO_2$). Accordingly, the tin suboxide ($SnO_{2-x}$) may serve as a conductive material together with the second conductive layer 103.

Since tin oxide ($SnO_2$) is reduced earlier than titanium oxide ($TiO_2$), titanium oxide ($TiO_2$) may not be reduced.

In some embodiments, titanium oxide ($TiO_2$) may be reduced earlier than dielectric layer 102 when the second conductive layer 103 is formed. Accordingly, the titanium oxide ($TiO_2$) may be modified to titanium suboxide ($TiO_{2-x}$) after the reduction.

FIGS. 16A to 16D are diagrams illustrating an example of a method for forming a semiconductor device. FIGS. 16A to 16D show an example of a method of forming a reduction sacrificial layer with an intermixing structure.

Figure 16A:
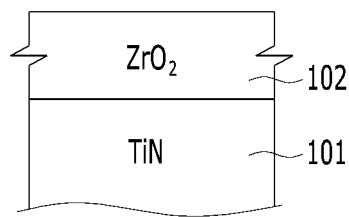
FIGS. 16A to 16D are diagrams illustrating another example of a method for forming a semiconductor device.

As shown in FIG. 16A, a first conductive layer 101 may be formed. A dielectric layer 102 may be formed on the first conductive layer 101. The first conductive layer 101 may include titanium nitride (TiN). The first conductive layer 101 is not limited to the titanium nitride. The first conductive layer 101 may be formed by ALD. The first conductive layer 101 may include 'ALD TiN'. ALD TiN may be deposited using a titanium source material and a nitrogen source material. The titanium source material may include $TiCl_4$, and the nitrogen source material may include $NH_3$.

The dielectric layer 102 may include a zirconium oxide-based layer. The dielectric layer 102 may include zirconium oxide ($ZrO_2$). The dielectric layer 102 may be formed by ALD.

Figure 16B:
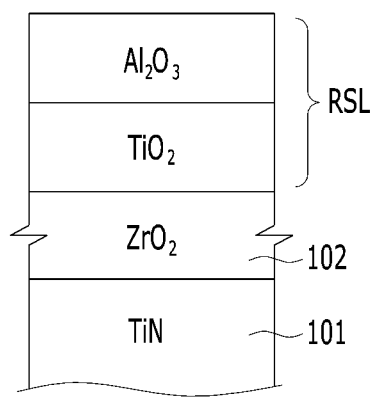

As shown in FIG. 16B, a reduction sacrificial layer RSL may be formed on the dielectric layer 102. The reduction sacrificial layer RSL may be formed by sequentially stacking titanium oxide ($TiO_2$) and aluminum oxide ($Al_2O_3$). The aluminum oxide ($Al_2O_3$) may have higher electronegativity than the titanium oxide ($TiO_2$). The reduction sacrificial layer RSL may have a small thickness. The reduction sacrificial layer RSL may have a thickness of approximately 0.1 to 2 nm. The reduction sacrificial layer RSL may be formed by ALD.

Figure 16C:
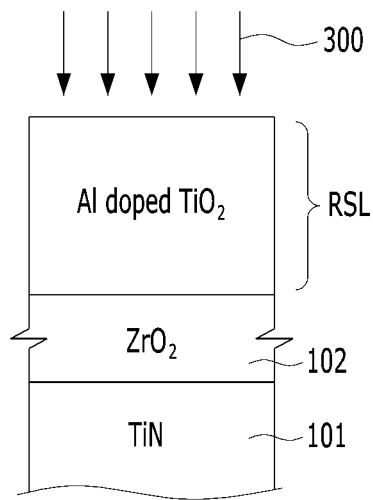

As shown in FIG. 16C, an anneal process 300 may be performed. The reduction sacrificial layer RSL may be exposed to the anneal process 300. The titanium oxide ($TiO_2$) and the aluminum oxide ($Al_2O_3$) may be intermixed with each other by the anneal process 300. An intermixing compound of the titanium oxide ($TiO_2$) and the aluminum oxide ($Al_2O_3$) may include aluminum-doped titanium oxide (Al-doped $TiO_2$). The aluminum-doped titanium oxide may serve as the reduction sacrificial layer RSL. The aluminum-doped titanium oxide may prevent the reduction of the dielectric layer 102 upon subsequent deposition of the second conductive layer 103. Thus, the leakage current may be reduced by doping aluminum having a high bandgap into titanium oxide having a high dielectric constant.

The anneal process 300 may be performed through an $NH_3$ atmosphere, plasma nitridation or plasma oxidation. The anneal process 300 may include a laser anneal process.

The anneal process 300 may be performed before subsequent formation of the second conductive layer 103. Thus, the reduction sacrificial layer RSL may be reduced in advance before the second conductive layer 103 is formed. The anneal process 300 may crystallize the dielectric layer 102 to increase the dielectric constant.

The aluminum-doped titanium oxide may have a higher dielectric constant than the dielectric layer 102. The aluminum-doped titanium oxide may include a compound of titanium oxide, and may further include aluminum oxide as a dopant.

Figure 16D:
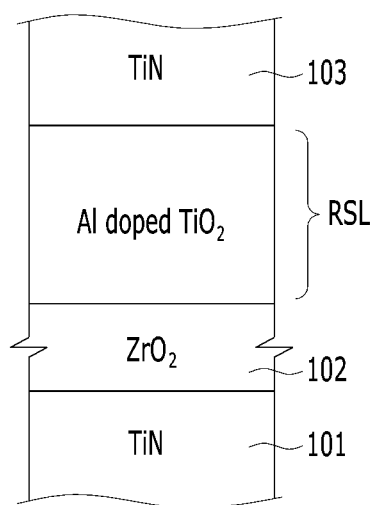

As shown in FIG. 16D, the second conductive layer 103 may be formed on the reduction sacrificial layer RSL. The second conductive layer 103 may include a metal, a metal nitride, a conductive metal oxide or combinations thereof. The second conductive layer 103 may include titanium (Ti), titanium nitride (TiN), tantalum nitride (TaN), tungsten (W), tungsten nitride (WN), ruthenium, iridium, ruthenium oxide, iridium oxide or combinations thereof. In the embodiment, the second conductive layer 103 may include titanium nitride. The second conductive layer 103 may be formed by ALD. Accordingly, the second conductive layer 103 may include 'ALD TiN'. ALD TiN may be deposited using a titanium source material and a nitrogen source material. The titanium source material may include $TiCl_4$, and the nitrogen source material may include $NH_3$. In some embodiments, a metal organic source may be used as the titanium source material.

When the second conductive layer 103 is formed, the dielectric layer 102 may be reduced by $NH_3$ which is the nitrogen source material. In the embodiment, since the reduction sacrificial layer RSL is formed in advance before the second conductive layer 103 is formed, the reduction of the dielectric layer 102 may be prevented. Therefore, an oxygen loss of the dielectric layer 102 may be suppressed.

In the embodiments described above, each of the semiconductor devices 111 to 154 may be a capacitor. For example, each of the semiconductor devices 111 to 154 may correspond to a capacitor of a DRAM. In the semiconductor devices 111 to 154, the first conductive layer 101 may be a bottom electrode of the capacitor, the dielectric layer 102 may be a dielectric layer of the capacitor, and the second conductive layer 103 may be a top electrode of the capacitor. Accordingly, the capacitor may include the reduction sacrificial layer RSL disposed between the dielectric layer and the top electrode.

Figure 17A:
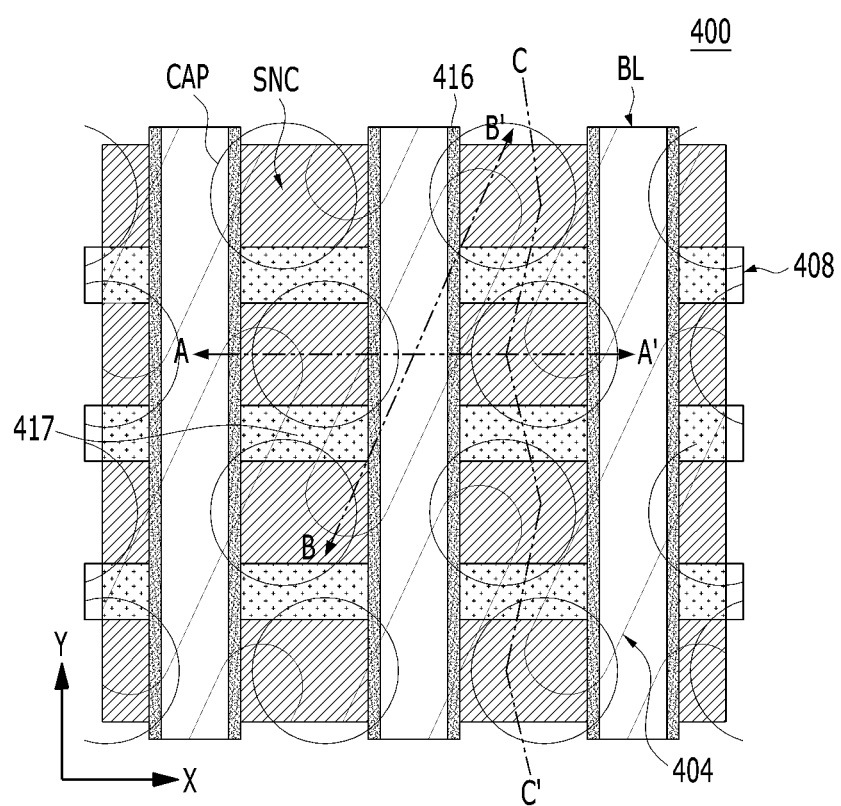
FIGS. 17A to 17C are diagrams illustrating a memory cell.
Figure 17B:
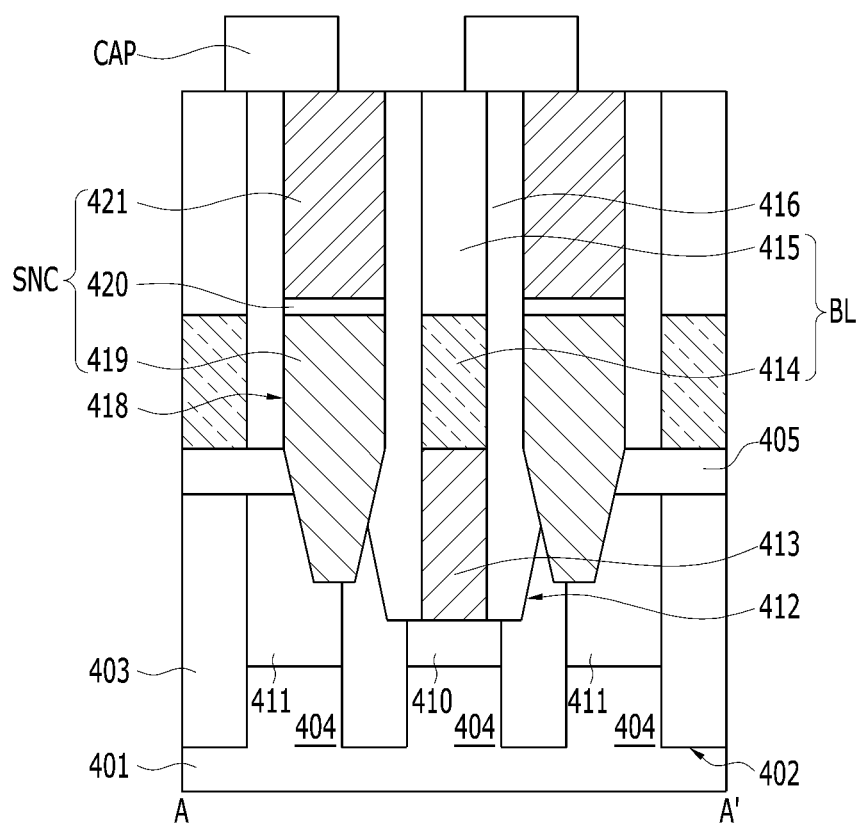
Figure 17C:
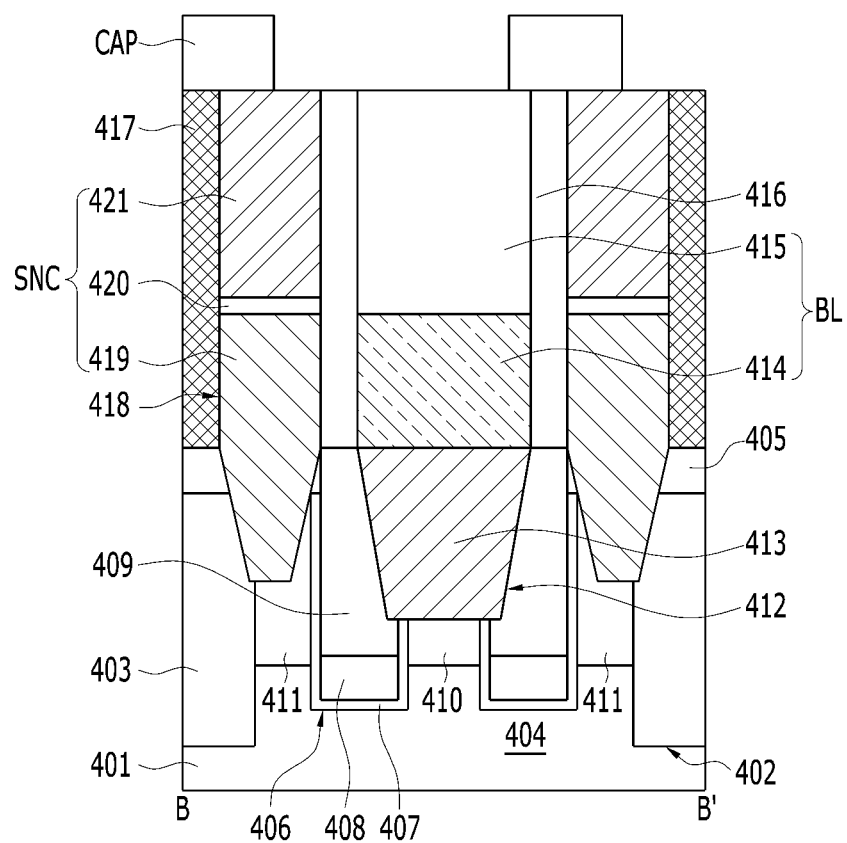

FIGS. 17A to 17C are diagrams illustrating a memory cell 400. FIG. 17B is a cross-sectional view of the memory cell 400 taken along a line A-A' of FIG. 17A. FIG. 17C is a cross-sectional view of the memory cell 400 taken along a line B-B' of FIG. 17A.

The memory cell 400 may include a cell transistor including a buried word line 408, a bit line 414 and a capacitor CAP. The capacitor CAP may correspond to any one of the semiconductor devices 111 to 154. The capacitor CAP may correspond to any one of the structures shown in FIGS. 7A to 14D.

The memory cell 400 is described in detail.

An isolation layer 403 and an active region 404 may be formed in a substrate 401. A plurality of active regions 404 may be defined by the isolation layer 403. The substrate 401 may be a material that is suitable for semiconductor processing. The substrate 401 may include a semiconductor substrate. The substrate 401 may be formed of a silicon-containing material. The substrate 401 may include silicon, monocrystalline silicon, polysilicon, amorphous silicon, silicon germanium, monocrystalline silicon germanium, polycrystalline silicon germanium, carbon-doped silicon, any combinations thereof or multi-layers of them. The substrate 401 may include another semiconductor material, such as germanium. The substrate 401 may include an III/V-group semiconductor substrate, for example, a chemical compound semiconductor substrate such as a gallium arsenide (GaAs). The substrate 401 may include a Silicon-On-Insulator (SOI) substrate. The isolation layer 403 may be formed in an isolation trench 402 through a Shallow Trench Isolation (STI) process.

A word line trench 406 may be formed in the substrate 401. The word line trench 406 may also be referred to as a gate trench. A gate dielectric layer 407 may be formed on the surface of the word line trench 406. A buried word line 408 which fills a portion of the word line trench 406 may be formed on the gate dielectric layer 407. The buried word line 408 may also be referred to as a buried gate electrode. A word line capping layer 409 may be formed on the buried word line 408. The top surface of the buried word line 408 may be lower than the top surface of the substrate 401. The buried word line 408 may be a low-resistivity metal material. In some embodiments, the buried word line 408 may be formed by sequentially stacking titanium nitride and tungsten. In some embodiments, the buried word line 408 may be formed of titanium nitride (TiN) only.

A first impurity region 410 and a second impurity region 411 may be formed in the substrate 401. The first and second impurity regions 410 and 411 may be spaced apart from each other by the word line trench 406. The first and second impurity regions 410 and 411 may also be referred to as first and second source/drain regions, respectively. The first and second impurity regions 410 and 411 may include an N-type impurity such as arsenic (As) and phosphorus (P). Consequently, the buried word line 408 and the first and second impurity regions 410 and 411 may become a cell transistor. The cell transistor may improve a short-channel effect due to the presence of the buried word line 408.

A bit line contact plug 413 may be formed over the substrate 401. The bit line contact plug 413 may be coupled to the first impurity region 410. The bit line contact plug 413 may be positioned inside a bit line contact hole 412. The bit line contact hole 412 may be formed in a hard mask layer 405. The hard mask layer 405 may be formed over the substrate 401. The bit line contact hole 412 may expose the first impurity region 410. The bottom surface of the bit line contact plug 413 may be lower than the top surface of the substrate 401. The bit line contact plug 413 may be formed of polysilicon or a metal material. A portion of the bit line contact plug 413 may have a smaller line width than the diameter of the bit line contact hole 412. The bit line 414 may be formed on the bit line contact plug 413. A bit line hard mask 415 may be formed on the bit line 414. The stacked structure of the bit line 414 and the bit line hard mask 415 may also be referred to as a bit line structure BL. The bit line 414 may have a linear shape that is extended in a direction crossing the buried word line 408. A portion of the bit line 414 may be coupled to the bit line contact plug 413. The bit line 414 may include a metal material. The bit line hard mask 415 may include a dielectric material.

A bit line spacer 416 may be formed on the sidewall of the bit line structure BL. The bottom portion of the bit line spacer 416 may be extended to be formed on both sidewalls of the bit line contact plug 413. The bit line spacer 416 may include silicon oxide, silicon nitride or a combination thereof. In some embodiments, the bit line spacer 416 may include an air gap. For example, the bit line spacer 416 may have a nitride-air gap-nitride (NAN) structure in which the air gap is located between silicon nitrides.

A storage node contact plug SNC may be formed between the neighboring bit line structures BL. The storage node contact plug SNC may be formed in a storage node contact hole 418. The storage node contact hole 418 may have a high aspect ratio. The storage node contact plug SNC may be coupled to the second impurity region 411. The storage node contact plug SNC may include a bottom plug 419 and a top plug 421. The storage node contact plug SNC may further include an ohmic contact layer 420 between the bottom plug 419 and the top plug 421. The ohmic contact layer 420 may include a metal silicide. The top plug 421 may include a metal material, and the bottom plug 419 may include a silicon-containing material.

When seen in a direction parallel to the bit line structure BL, a plug isolation layer 417 may be formed between the neighboring storage node contact plugs SNC. The plug isolation layer 417 may be formed between the neighboring bit line structures BL, and may provide the storage node contact hole 418 along with the hard mask layer 405.

The capacitor CAP may be formed on the top plug 421.

FIGS. 18A to 18F are cross-sectional views illustrating application examples of the capacitor CAP shown in FIG. 17B.

Figure 18A:
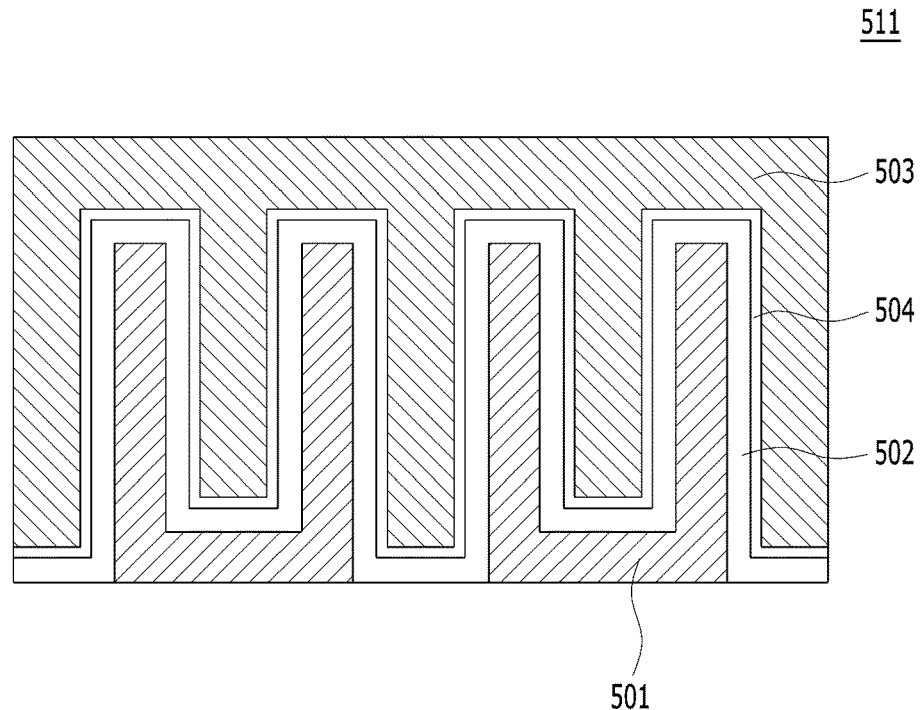
FIGS. 18A to 18F are cross-sectional views illustrating application examples of a capacitor shown in FIG. 17B.

Referring to FIG. 18A, a capacitor 511 may include a bottom electrode 501, a dielectric layer 502, a reduction sacrificial layer 504, and a top electrode 503. The bottom electrode 501 may be formed in a cylinder shape. The dielectric layer 502 may be formed on the bottom electrode 501, and the reduction sacrificial layer 504 may be formed on the dielectric layer 502. The top electrode 503 may be formed on the reduction sacrificial layer 504. The reduction sacrificial layer 504 may correspond to any one of the reduction sacrificial layers described above according to embodiments.

Hereinafter, detailed descriptions of components that are the same as or similar to those of the capacitor 511 shown in FIG. 18A will be omitted.

Figure 18B:
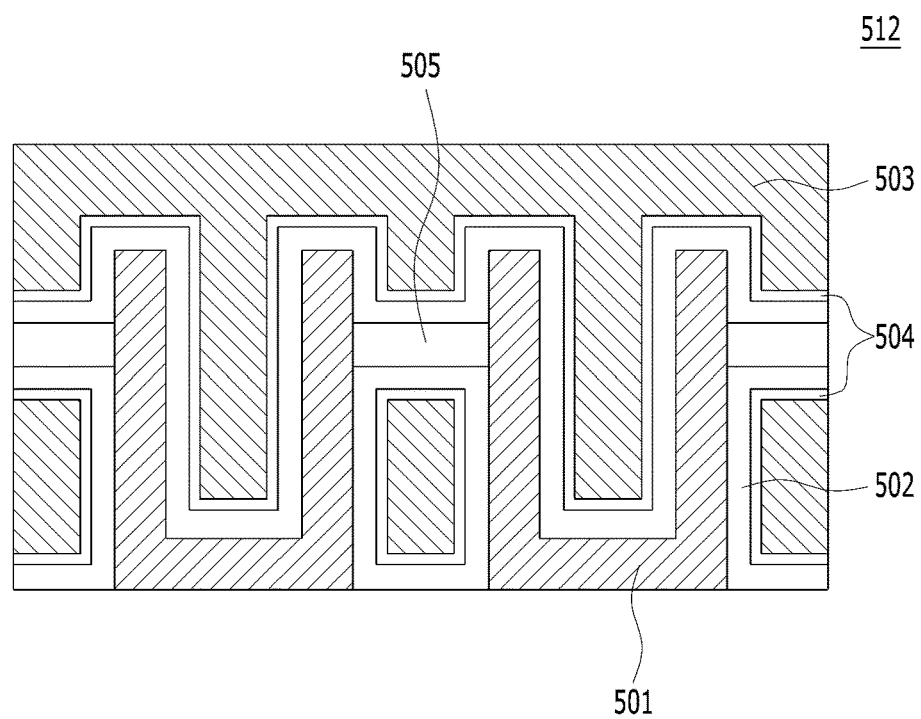

Referring to FIG. 18B, a capacitor 512 may include a bottom electrode 501 of a cylinder shape, a dielectric layer 502, a reduction sacrificial layer 504, and a top electrode 503. The capacitor 512 may further include a supporter 505. The supporter 505 may be a structure for supporting an outer wall of the bottom electrode 501. The supporter 505 may, for example, include silicon nitride.

Figure 18C:
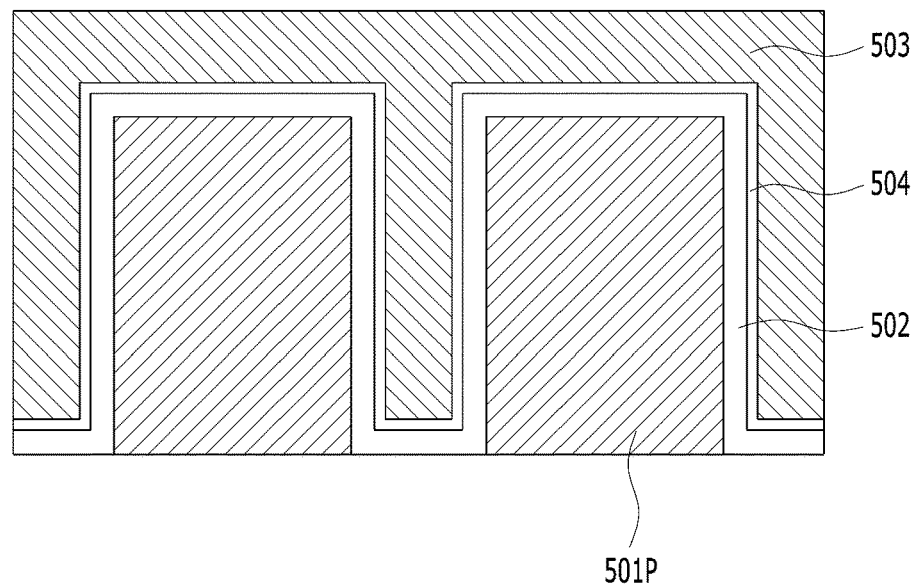
Figure 18D:
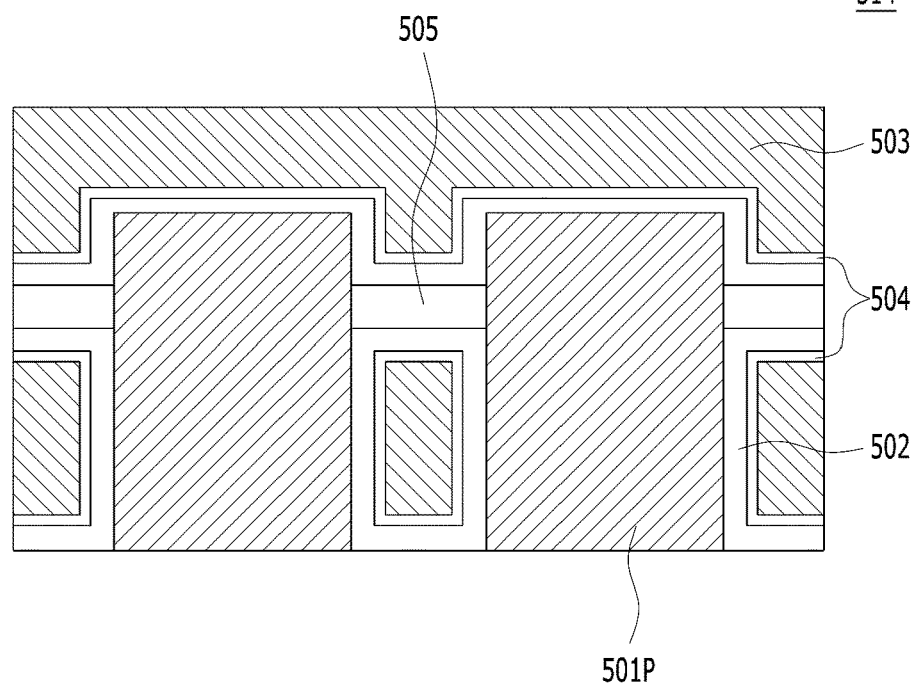

Referring to FIGS. 18C and 18D, each of capacitors 513 and 514 may include a bottom electrode 501P of a pillar shape, a dielectric layer 502, a reduction sacrificial layer 504, and a top electrode 503. The capacitor 514 shown in FIG. 18D may further include a supporter 505.

Figure 18E:
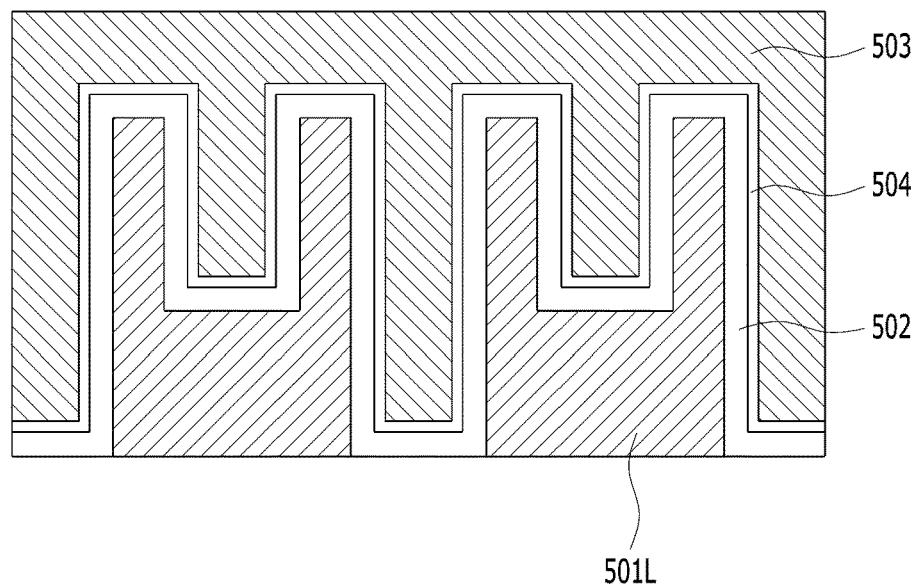
Figure 18F:
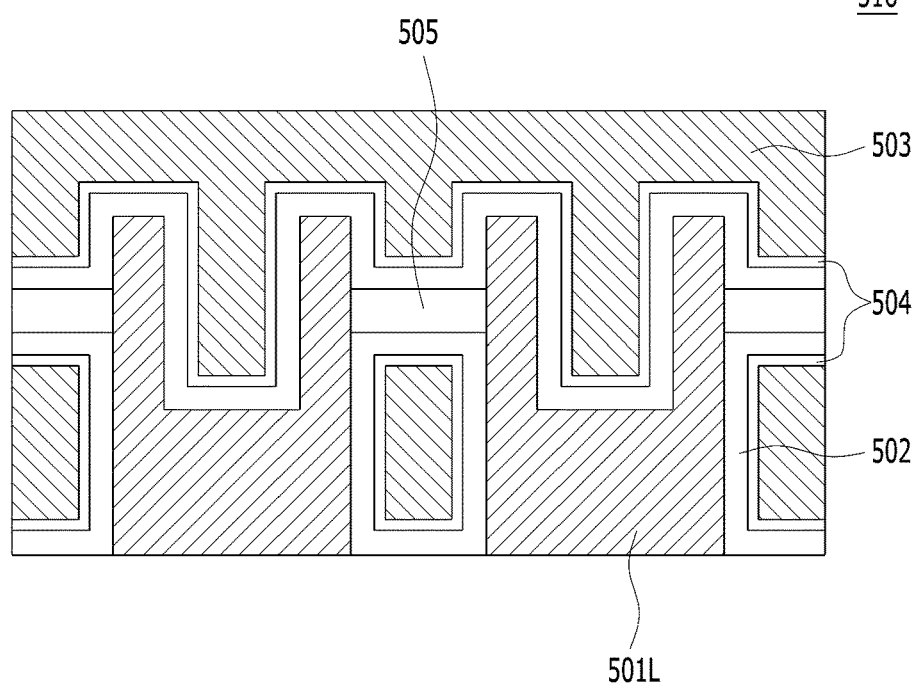

Referring to FIGS. 18E and 18F, each of capacitors 515 and 516 may include a bottom electrode 501L of a pylinder shape, a dielectric layer 502, a reduction sacrificial layer 504, and a top electrode 503. The capacitor 516 shown in FIG. 18F may further include a supporter 505. The bottom electrode 501L may include a bottom region and a top region. The bottom region of the bottom electrode 501L may be of a pillar shape, and the top region of the bottom electrode 501L may be of a cylinder shape. A hybrid structure of the pillar shape and the cylinder shape may also be referred to as the pylinder shape.

As described above, the reduction sacrificial layer 504 may be formed in the process of forming the capacitors 511 to 516, thereby preventing the dielectric layer 502 from being reduced, reducing the $T_{ox}$ of the dielectric layer 502 and preventing a leakage. Accordingly, a high-integrated dynamic random access memory (DRAM) whose refresh characteristics and reliability are improved may be fabricated.

The semiconductor devices in accordance with the above-describe embodiments are not limited to the DRAM but may be applied to a memory such as a static random access memory (SRAM), a flash memory, a ferroelectric random access memory (FeRAM), a magnetic random access memory (MRAM) and a phase change random access memory (PRAM).

According to the embodiments, a reduction preventing material may be formed between a dielectric layer and a conductive layer, thereby suppressing oxygen loss of the dielectric layer.

According to the embodiments, a high bandgap material and a high work function material may be formed between a dielectric layer and a conductive layer, thereby reducing the equivalent oxide layer thickness of the dielectric layer and preventing the leakage current.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A capacitor comprising:
a bottom electrode;
a dielectric layer formed over the bottom electrode;
a top electrode formed over the dielectric layer;
a first reduction sacrificial layer having a higher electronegativity than the dielectric layer and formed between the dielectric layer and the top electrode;
a second reduction sacrificial layer having higher electronegativity than the first reduction sacrificial layer and formed between the first reduction sacrificial layer and the top electrode;
a first interface control layer having a higher electronegativity than the dielectric layer and formed between the dielectric layer and the bottom electrode; and
a second interface control layer having a higher electronegativity than the dielectric layer and formed between the first interface control layer and the bottom electrode,
wherein the second reduction sacrificial layer has a larger vertical thickness than the first reduction sacrificial layer.

2. The capacitor of claim 1, wherein the dielectric layer includes a zirconium oxide-based layer or a hafnium oxide-based layer, and the first reduction sacrificial layer and the second reduction sacrificial layer include a material having higher electronegativity than the zirconium oxide-based layer and the hafnium oxide-based layer.

3. The capacitor of claim 1, wherein each of the first reduction sacrificial layer and the second reduction sacrificial layer includes titanium oxide, tantalum oxide, aluminum oxide, tin oxide, niobium oxide, germanium oxide, silicon oxide, molybdenum oxide, ruthenium oxide, iridium oxide or combinations thereof, and the first reduction sacrificial layer and the second reduction sacrificial layer are different from each other.

4. The capacitor of claim 1, wherein the first reduction sacrificial layer includes titanium oxide or tantalum oxide, and the second reduction sacrificial layer includes aluminum oxide, tin oxide, niobium oxide, germanium oxide, silicon oxide, molybdenum oxide, ruthenium oxide, iridium oxide or combinations thereof.

5. The capacitor of claim 1, wherein each of the first reduction sacrificial layer and the second reduction sacrificial layer includes one suboxide of materials selected from titanium, tantalum, aluminum, tin, molybdenum, ruthenium, iridium, niobium, germanium, silicon and combinations thereof, and the first reduction sacrificial layer and the second reduction sacrificial layer are different from each other.

6. The capacitor of claim 1, wherein the first and second reduction sacrificial layer includes a conductive metal oxide.

7. The capacitor of claim 1, wherein each of the first interface control layer and the second interface control layer includes titanium oxide, tantalum oxide, aluminum oxide, tin oxide, niobium oxide, germanium oxide, silicon oxide, molybdenum oxide, ruthenium oxide, iridium oxide or combinations thereof, and the first interface control layer and the second interface control layer are different from each other.

8. The capacitor of claim 1, wherein the first interface control layer includes aluminum oxide, tin oxide, niobium oxide, germanium oxide, silicon oxide, molybdenum oxide, ruthenium oxide, iridium oxide or combinations thereof, and the second interface control layer includes titanium oxide or tantalum oxide.

9. The capacitor of claim 1, wherein the first interface control layer and the second reduction sacrificial layer include the same material.

10. The capacitor of claim 1, wherein the first interface control layer and the second reduction sacrificial layer includes aluminum oxide, tin oxide, niobium oxide, germanium oxide, silicon oxide, molybdenum oxide, ruthenium oxide, iridium oxide or combinations thereof.

11. The capacitor of claim 1, wherein the second interface control layer and the first reduction sacrificial layer include the same material.

12. The capacitor of claim 1, wherein the second interface control layer and the first reduction sacrificial layer includes titanium oxide or tantalum oxide.

13. The capacitor of claim 1, wherein the first interface control layer and the second reduction sacrificial layer includes aluminum oxide, tin oxide, niobium oxide, germanium oxide, silicon oxide, molybdenum oxide, ruthenium oxide, iridium oxide or combinations thereof, and the second interface control layer and the first reduction sacrificial layer includes titanium oxide or tantalum oxide.

14. The capacitor of claim 1, wherein the first interface control layer and the second reduction sacrificial layer is formed of niobium oxide.

15. The capacitor of claim 1, wherein the dielectric layer includes:
ZA ($ZrO_2/Al_2O_3$), ZAZ ($ZrO_2/Al_2O_3/ZrO_2$), HA ($HfO_2/Al_2O_3$), HAH ($HfO_2/Al_2O_3/HfO_2$),
ZAZA ($ZrO_2/Al_2O_3/ZrO_2/Al_2O_3$), ZAZAZ ($ZrO_2/Al_2O_3/ZrO_2/Al_2O_3/ZrO_2$),
HAHA ($HfO_2/Al_2O_3/HfO_2/Al_2O_3$) or HAHAH ($HfO_2/Al_2O_3/HfO_2/Al_2O_3/HfO_2$).

16. The capacitor of claim 1, wherein the top electrode includes a SiGe/TiN stack.

17. The capacitor of claim 1, wherein the second reduction sacrificial layer has the vertical thickness of 1 nm or less, and the vertical thickness of the second reduction sacrificial layer is larger than the vertical thickness of the first reduction sacrificial layer.

18. The capacitor of claim 1, wherein the first interface control layer and the second reduction sacrificial layer have a higher electronegativity than the first reduction sacrificial layer and the second interface control layer.

* * * * *